US008046727B2

(12) United States Patent
Solomon

(10) Patent No.: US 8,046,727 B2
(45) Date of Patent: Oct. 25, 2011

(54) IP CORES IN RECONFIGURABLE THREE DIMENSIONAL INTEGRATED CIRCUITS

(76) Inventor: Neal Solomon, Oakland, CA (US)

(*) Notice: Subject to any disclaimer, the term of this patent is extended or adjusted under 35 U.S.C. 154(b) by 517 days.

(21) Appl. No.: 12/283,453

(22) Filed: Sep. 12, 2008

(65) Prior Publication Data

US 2009/0070728 A1 Mar. 12, 2009

Related U.S. Application Data

(60) Provisional application No. 60/993,580, filed on Sep. 12, 2007.

(51) Int. Cl.
*G06F 17/50* (2006.01)
*G06J 1/00* (2006.01)
*G06F 15/04* (2006.01)
*H03K 19/177* (2006.01)
*H01L 25/00* (2006.01)

(52) U.S. Cl. ........ 716/116; 716/121; 716/128; 716/138; 708/1; 708/130; 708/139; 708/230; 326/38; 326/41; 326/47; 326/101

(58) Field of Classification Search .............. 716/116, 716/121, 128, 138; 708/1, 130, 139, 230; 326/38, 41, 47, 101
See application file for complete search history.

(56) References Cited

U.S. PATENT DOCUMENTS 7,307,449 B1 * 12/2007 Redgrave et al. ............... 326/38
7,822,881 B2 * 10/2010 Vorbach et al. ................... 710/8
7,839,166 B2 * 11/2010 Schmit et al. .................. 326/41

OTHER PUBLICATIONS

Meleis et al., "Architectural Design of a Three Dimensional FPGA", Proceedings of the Seventeenth Conference on Advanced Research in VLSI, Sep. 15-16, 1997, pp. 256-268.*
Chiricescu et al., "A Three-Dimensional FPGA with an Integrated Memory for In-Application Reconfiguration Data", Proceedings of the 1998 IEEE International Symposium on Circuits and Systems, vol. 2, May 31-Jun. 3, 1998, pp. 232-235.*
Rahman et al., "Wiring Requirement and Three-Dimensional Integration Technology for Field Programmable Gate Arrays," IEEE Transactions on Very Large Scale Integration (VLSI) Systems, vol. 11, No. 1, Feb. 2003, pp. 44-54.*

* cited by examiner

*Primary Examiner* — Phallaka Kik

(57) ABSTRACT

The invention describes IP cores applied to 3D FPGAs, CPLDs and reprogrammable SoCs. IP cores are (a) used for continuously evolvable hardware using 3D logic circuits, (b) applied with optimization metaheuristic algorithms, (c) applied by matching combinatorial logic of netlists generated by Boolean algebra to combinatorial geometry of CPLD architecture by reaggregating IP core elements and (d) used to effect continuous recalibration of IP cores with evolvable hardware in indeterministic environments for co-evolutionary reprogrammability.

11 Claims, 21 Drawing Sheets

| IP Core Typology | | |
|---|---|---|
| | ASIC configuration | FPGA oscillation between ASIC positions |
| DSP<br>- Audio<br>- Video<br>- Wireless | | |
| Embedded<br>- Controller<br>- Power Mngt | | |
| Multi-functional | | |

| IP Core and FPGA types | | | |
|---|---|---|---|
| Deterministic | | Indeterministic | |
| ASIC | FPGA | Programmable | Continuously Programmable |
| | Single-use IP core | IP core reusability | Adaptive IP core with IP core elements |

| Phases | | | | |
|---|---|---|---|---|
| Reusable IP core elements | 1 | 2 | 3 | 4 |
| A | ○ | ○ |  | ○ |
| B |  | ○ |  |  |
| C | ○ |  | ○ | ○ |
| D | ○ | ○ | ○ | ○ |
| E |  |  | ○ |  |
| F | ○ |  | ○ |  |
| G |  | ○ |  | ○ |
| H |  |  |  | ○ |

| IP Core Library (IP Core Elements) List of categories | | | | | | |
|---|---|---|---|---|---|---|
| DAC/ADC Structures | A,B,C, D,E | | | | | |
| Image Sensor structures | | F,G, H,I | | | | |
| MAC Structures | | | J,K,L | | | |
| ATSC Protocols | | | | M,N, O,P | | |
| Wireless Protocols | | | | | Q,R,S, T,U | |
| Embedded Controller Protocols | | | | | | U,W,X, Y,Z |

IP CORES IN RECONFIGURABLE THREE DIMENSIONAL INTEGRATED CIRCUITS

CROSS-REFERENCES TO RELATED APPLICATIONS

The present application claims the benefit of priority under 35 U.S.C. §119 from U.S. Provisional Patent Application Ser. No. 60/993,580, filed on Sep. 12, 2007, the disclosure of which is hereby incorporated by reference in their entirety for all purposes.

FIELD OF THE INVENTION

The invention involves IP cores for reconfigurable system on chip (SoC) and network on chip (NoC) semiconductor technology. In particular, the reconfigurable components of the SoC are adaptive and represent evolvable hardware (EHW), consisting of field programmable gate array (FPGA) and complex programmable logic device (CPLD) architectures. The system has elements of intelligent microsystems that signify bio-inspired computing behaviors, exemplified in hardware-software interactivity. Because IP cores are used in hybrid heterostructure semiconductor devices that incorporate EHW, intelligent behaviors and synthetic computer interconnect network fabrics, the system facilitates polymorphous computing architecture (PCA) and cognitive computing.

BACKGROUND OF THE INVENTION

The challenge of modern computing is to build economically efficient chips that incorporate more transistors to meet the goal of achieving Moore's law of doubling performance every two years. The limits of semiconductor technology are affecting this ability to grow in the next few years, as transistors become smaller and chips become bigger and hotter. The semiconductor industry has developed the system on a chip (SoC) as a way to continue high performance chip evolution.

So far, there have been four main ways to construct a high performance semiconductor. First, chips have multiple cores. Second, chips optimize software scheduling. Third, chips utilize efficient memory management. Fourth, chips employ polymorphic computing. To some degree, all of these models evolve from the Von Neumann computer architecture developed after WWII in which a microprocessor's logic component fetches instructions from memory.

The simplest model for increasing chip performance employs multiple processing cores. By multiplying the number of cores by eighty, Intel has created a prototype teraflop chip design. In essence, this architecture uses a parallel computing approach similar to supercomputing parallel computing models. Like some supercomputing applications, this approach is limited to optimizing arithmetic-intensive applications such as modeling.

The Tera-op, Reliable, Intelligently Adaptive Processing System (TRIPS), developed at the University of Texas with funding from DARPA, focuses on software scheduling optimization to produce high performance computing. This model's "push" system uses data availability to fetch instructions, thereby putting additional pressure on the compiler to organize the parallelism in the high speed operating system. There are three levels of concurrency in the TRIPS architecture, including instruction-level parallelism (ILP), thread-level parallelism (TLP) and data-level parallelism (DLP). The TRIPS processor will process numerous instructions simultaneously and map them onto a grid for execution in specific nodes. The grid of execution nodes is reconfigurable to optimize specific applications. Unlike the multi-core model, TRIPS is a uniprocessor model, yet it includes numerous components for parallelization.

The third model is represented by the Cell microprocessor architecture developed jointly by the Sony, Toshiba and IBM (STI) consortium. The Cell architecture uses a novel memory "coherence" architecture in which latency is overcome with a bandwidth priority and in which power usage is balanced with peak computational usage. This model integrates a microprocessor design with coprocessor elements; these eight elements are called "synergistic processor elements" (SPEs). The Cell uses an interconnection bus with four unidirectional data flow rings to connect each of four processors with their SPEs, thereby meeting a teraflop performance objective. Each SPE is capable of producing 32 GFLOPS of power in the 65 nm version, which was introduced in 2007.

The MOrphable Networked Micro-ARCHitecture (MONARCH) uses six reduced instruction set computing (RISC) microprocessors, twelve arithmetic clusters and thirty-one memory clusters to achieve a 64 GFLOPS performance with 60 gigabytes per second of memory. Designed by Raytheon and USC/ISI from DARPA funding, the MONARCH differs distinctly from other high performance SoCs in that it uses evolvable hardware (EHW) components such as field programmable compute array (FPCA) and smart memory architectures to produce an efficient polymorphic computing platform.

MONARCH combines key elements in the high performance processing system (HPPS) with Data Intensive Architecture (DIVA) Processor in Memory (PIM) technologies to create a unified, flexible, very large scale integrated (VLSI) system. The advantage of this model is that reprogrammability of hardware from one application-specific integrated circuit (ASIC) position to another produces faster response to uncertain changes in the environment. The chip is optimized to be flexible to changing conditions and to maximize power efficiency (3-6 GFLOPS per watt). Specific applications of MONARCH involve embedded computing, such as sensor networks.

These four main high performance SoC models have specific applications for which they are suited. For instance, the multi-core model is optimized for arithmetic applications, while MONARCH is optimized for sensor data analysis. However, all four also have limits.

The multi-core architecture has a problem of synchronization of the parallel micro-processors that conform to a single clocking model. This problem limits their responsiveness to specific types of applications, particularly those that require rapid environmental change. Further, the multi-core architecture requires "thread-aware" software to exploit its parallelism, which is cumbersome and produces quality of service (QoS) problems and inefficiencies.

By emphasizing its compiler, the TRIPS architecture has the problem of optimizing the coordination of scheduling. This bottleneck prevents peak performance over a prolonged period.

The Cell architecture requires constant optimization of its memory management system, which leads to QoS problems.

Finally, MONARCH depends on static intellectual property (IP) cores that are limited to combinations of specified pre-determined ASICs to program its evolvable hardware components. This restriction limits the extent of its flexibility, which was precisely its chief design advantage.

In addition to SoC models, there is a network on a chip (NoC) model, introduced by Arteris in 2007. Targeted to the communications industry, the 45 nm NoC is a form of SoC that uses IP cores in FPGAs for reprogrammable functions and that features low power consumption for embedded computing applications. The chip is optimized for on-chip communications processing. Though targeted at the communications industry, particularly wireless communications, the chip has limits of flexibility that it was designed to overcome, primarily in its deterministic IP core application software.

Various implementations of FPGAs represent reconfigurable computing. The most prominent examples are the Xilinx Virtex-II Pro and Virtex-4 devices that combine one or more microprocessor cores in an FPGA logic fabric. Similarly, the Atmel FPSLTC processor combines an AVR processor with programmable logic architecture. The Atmel microcontroller has the FPGA fabric on the same die to produce a fine-grained reconfigurable device. These hybrid FPGAs and embedded microprocessors represent a generation of system on a programmable chip (SOPC). While these hybrids are architecturally interesting, they possess the limits of each type of design paradigm, with restricted microprocessor performance and restricted deterministic IP core application software. Though they have higher performance than a typical single core microprocessor, they are less flexible than a pure FPGA model.

All of these chip types are two dimensional planar micro system devices. A new generation of three dimensional integrated circuits and components is emerging that is noteworthy as well. The idea to stack two dimensional chips by sandwiching two or more ICs using a fabrication process required a solution to the problem of creating vertical connections between the layers. IBM solved this problem by developing "through silicon vias" (TSVs) which are vertical connections "etched through the silicon wafer and filled with metal." This approach of using TSVs to create 3D connections allows the addition of many more pathways between 2D layers. However, this 3D chip approach of stacking existing 2D planar IC layers is generally limited to three or four layers. While TSVs substantially limit the distance that information traverses, this stacking approach merely evolves the 2D approach to create a static 3D model.

In U.S. Pat. No. 5,111,278, Echelberger describes a 3D multi-chip module system in which layers in an integrated circuit are stacked by using aligned TSVs. This early 3D circuit model represents a simple stacking approach. U.S. Pat. No. 5,426,072 provides a method to manufacture a 3D IC from stacked silicon on insulation (SOI) wafers. U.S. Pat. No. 5,657,537 presents a method of stacking two dimensional circuit modules and U.S. Pat. No. 6,355,501 describes a 3D IC stacking assembly technique.

Recently, 3D stacking models have been developed on chip in which several layers are constructed on a single complementary metal oxide semiconductor (CMOS) die. Some models have combined eight or nine contiguous layers in a single CMOS chip, though this model lacks integrated vertical planes. MIT's microsystems group has created 3D ICs that contain multiple layers and TSVs on a single chip.

3D FPGAs have been created at the University of Minnesota by stacking layers of single planar FPGAs. However, these chips have only adjacent layer connectivity.

3D memory has been developed by Samsung and by BeSang. The Samsung approach stacks eight 2-Gb wafer level processed stack packages (WSPs) using TSVs in order to minimize interconnects between layers and increase information access efficiency. The Samsung TSV method uses tiny lasers to create etching that is later filled in with copper. BeSang combines 3D package level stacking of memory with a logic layer of a chip device using metal bonding.

See also U.S. Pat. No. 5,915,167 for a description of a 3D DRAM stacking technique, U.S. Pat. No. 6,717,222 for a description of a 3D memory IC, U.S. Pat. No. 7,160,761 for a description of a vertically stacked field programmable nonvolatile memory and U.S. Pat. No. 6,501,111 for a description of a 3D programmable memory device.

Finally, in the supercomputing sphere, the Cray T3D developed a three dimensional supercomputer consisting of 2048 DEC Alpha chips in a torus networking configuration.

In general, all of the 3D chip models merely combine two or more 2D layers. They all represent a simple bonding of current technologies. While planar design chips are easier to make, they are not generally high performance.

Prior systems demonstrate performance limits, programmability limits, multi-functionality limits and logic and memory bottlenecks. There are typically trade-offs of performance and power.

The present invention views the system on a chip as an ecosystem consisting of significant intelligent components. The prior art for intelligence in computing consists of two main paradigms. On the one hand, the view of evolvable hardware (EHW) uses FPGAs as examples. On the other hand, software elements consist of intelligent software agents that exhibit collective behaviors. Both of these hardware and software aspects take inspiration from biological domains.

First, the intelligent SoC borrows from biological concepts of post-initialized reprogrammability that resembles a protein network that responds to its changing environmental conditions. The interoperation of protein networks in cells is a key behavioral paradigm for the iSoC. The slowly evolving DNA root structure produces the protein network elements, yet the dynamics of the protein network are interactive with both itself and its environment.

Second, the elements of the iSoC resemble the subsystems of a human body. The circulatory system represents the routers, the endocrine system is the memory, the skeletal system is comparable to the interconnects, the nervous system is the autonomic process, the immune system provides defense and security as it does in a body, the eyes and ears are the sensor network and the muscular system is the bandwidth. In this analogy, the brain is the central controller.

For the most part, SoCs require three dimensionality in order to achieve high performance objectives. In addition, SoCs require multiple cores that are reprogrammable so as to maintain flexibility for multiple applications. Such reprogrammability allows the chip to be implemented cost effectively. Reprogrammability, moreover, allows the chip to be updatable and future proof. In some versions, SoCs need to be power efficient for use in embedded mobile devices. Because they will be prominent in embedded devices, they also need to be fault tolerant. By combining the best aspects of deterministic microprocessor elements with indeterministic EHW elements, an intelligent SoC efficiently delivers superior performance.

While the design criteria are necessary, economic efficiency is also required. Computational economics reveals a comparative cost analysis that includes efficiency maximization of (a) power, (b) interconnect metrics, (c) transistor per memory metrics and (d) transistor per logic metrics.

Problems that the System Solves

Optimization problems that the system solves can be divided into two classes: bi-objective optimization problems (BOOPs) and multi-objective optimization problems (MOOPs).

BOOPs consist of trade-offs in semiconductor factors such as (a) energy consumption versus performance, (b) number of transistors versus heat dissipation, (c) interconnect area versus performance and (d) high performance versus low cost.

Regarding MOOPs, the multiple factors include: (a) thermal performance (energy/heat dissipation), (b) energy optimization (low power use), (c) timing performance (various metrics), (d) reconfiguration time (for FPGAs and CPLDs), (e) interconnect length optimization (for energy delay), (f) use of space, (g) bandwidth optimization and (h) cost (manufacture and usability) efficiency. The combination of solutions to trade-offs of multiple problems determines the design of specific semiconductors. The present system presents a set of solutions to these complex optimization problems.

One of the chief problems is to identify ways to limit latency. Latency represents a bottleneck in an integrated circuit when the wait to complete a task slows down the efficiency of the system. Examples of causes of latency include interconnect routing architectures, memory configuration and interface design. Limiting latency problems requires the development of methods for scheduling, anticipation, parallelization, pipeline efficiency and locality-priority processing.

SUMMARY OF THE INVENTION

FPGAs work by employing intellectual property (IP) cores, which are customized designs typically developed, and patented, by third party vendors. IP cores are a form of designer logic that appreciably improves the flexibility of FPGAs for performing specific combinations of tasks.

IP cores are divided into three main categories: (a) hard cores, (b) firm cores and (c) soft cores. Hard cores are physical manifestations of specific hardwired structures embodied in the initial design by the manufacturer of reconfigurable hardware. Hard cores, or hard macros, have coarse granularity and are not modified by customers. Firm cores, or semi-hard cores, have medium granularity and are configurable to various applications. Soft cores have fine granularity and represent the majority of third party non-proprietary open source software applications.

IP cores are used by each IP logic block to modify the configuration of device drivers or memory controllers as well as to reprogram FPGA gates and interconnects to activate reconfigurability. In general, IP cores are a form of automated customized macro that rearranges an FPGA structure to perform pre-set functions.

IP cores are classified by their application, for example, embedded controllers, DSP applications or multifunctional applications.

3D FPGAs require a new type of IP cores. Because the integrated FPGAs are continuously reprogrammable on the layer-level, they are indeterministically programmable and environmentally interactive using adaptive IP cores. Not only are the IP cores evolvable, they are also co-evolutionary and adaptive; there is interaction between the software and the hardware. The concept of IP core elements is introduced in which specific units of IP cores recombine using combinatorial logic in a novel 3D combinatorial geometrical environment.

Novelties of the Invention

The present invention uses evolvable IP cores for indeterministic 3D FPGA and SoC reprogrammability. The invention applies novel metaheuristics to optimize MOOP solutions in reconfigurable hardware. The invention also describes methods to recombine IP core elements for applying combinatorial logic to 3D SoC components for reaggregation processes.

ADVANTAGES OF THE INVENTION

The present invention uses IP cores for 3D ICs that provide numerous advantages. First, customers save substantial time and resources in designing and testing the chip by programming, and reprogramming, it after production. Second, customer time to market of specific applications is vastly reduced by production of a generic hardware architecture and later implementation of IP cores. Application functions can thus be designed after chip production. This increases flexibility for customers.

The IP designs are reusable, particularly because they combine 3D IP core elements in unique configurations. The use and recombination of 3D IP core elements allow the development of complex applications for indeterministic continuous reprogrammability using the iSoC.

Acronyms
3D, three dimensional
ASIC, application specific integrated circuit
BOOP, bi-objective optimization problem
CMOS, complementary metal oxide semiconductor
CPLD, complex programmable logic device
D-EDA, dynamic electronic design automation
DIVA, data intensive architecture
DLP, data level parallelism
EDA, electronic design automation
EHW, evolvable hardware
eMOOP, evolvable multi-objective optimization problem
Flops, floating operations per second
FPCA, field programmable compute array
FPGA, field programmable gate array
HPPS, high performance processing system
ILP, instruction level parallelism
IP, intellectual property
iSoC, intelligent system on a chip
LUT, look up table
MEMS, micro electro mechanical system
MONARCH, morphable networked micro-architecture
MOOP, multi-objective optimization problem
MPSOC, multi-processor system on a chip
NEMS, nano electro mechanical system
NoC, network on a chip
PCA, polymorphous computing architecture
PIM, processor in memory
RISC, reduced instruction set computing
SCOC, supercomputer on a chip
SoC, system on a chip
SOI, silicon on insulation
SOPC, system on a programmable chip
SPE, synergistic processor element
TLP, thread level parallelism
TRIPS, Tera-op reliable intelligently adaptive processing system
TSV, through silicon via
VLSI, very large scale integration
WSPS, wafer level processed stack packages

DETAILED DESCRIPTION OF THE INVENTION

Figure 1:
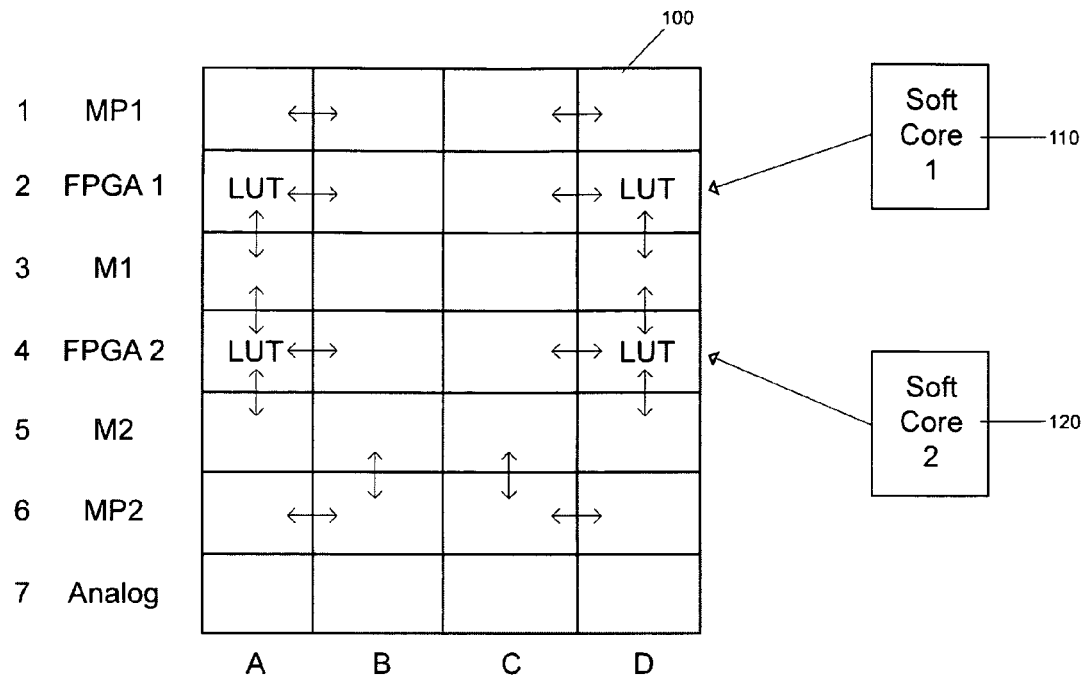
FIG. 1 is a schematic diagram of a side view of a multilayer hybrid IC.

FIG. 1 shows the side view of a multilayer hybrid IC. Layers 1 and 6 consist of microprocessors, layers 2 and 4 consist of FPGAs, layers 3 and 5 consist of memory components and layer 7 consists of analog components. LUTs are in the outside edges of the FPGA layers. The arrows indicate the interactions between tiles in the IC. Soft core 1 (110) interacts with a LUT on FPGA 1, while soft core 2 (120) interacts with a LUT on FPGA 2. The soft cores update the program code on the FPGAs.

Figure 2:
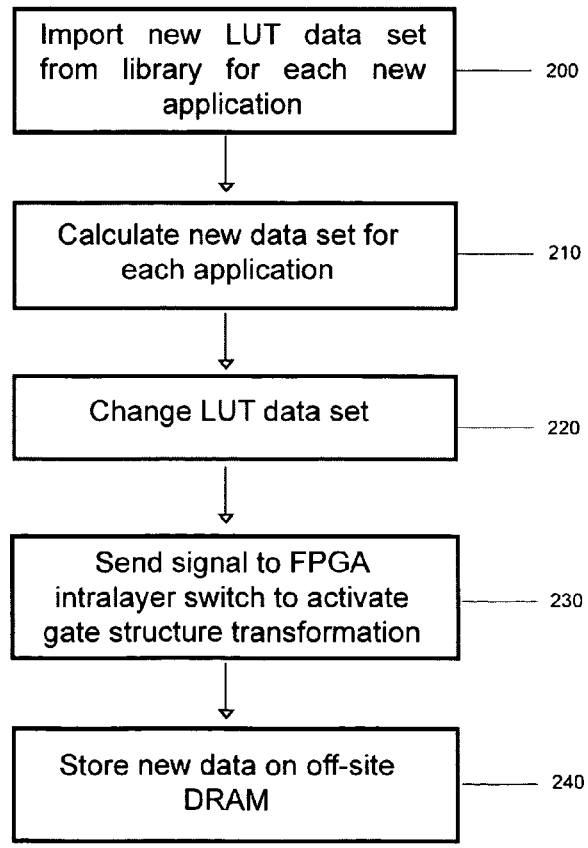
FIG. 2 is a flow chart of a process for the organization of netlists to store new data in a LUT.

FIG. 2 is a flow chart of a process for the organization of netlists to store new data in a LUT. Once LUT data sets are imported from a library for each new application (200), a new data set are calculated for each application (210). The LUT data set is then changed (220) and a signal is sent to the FPGA intra-layer switch to activate the gate structure transformation (230) to reorganize the FPGA gate arrays. New data is then stored on off-site DRAM (240) components.

Figure 3:
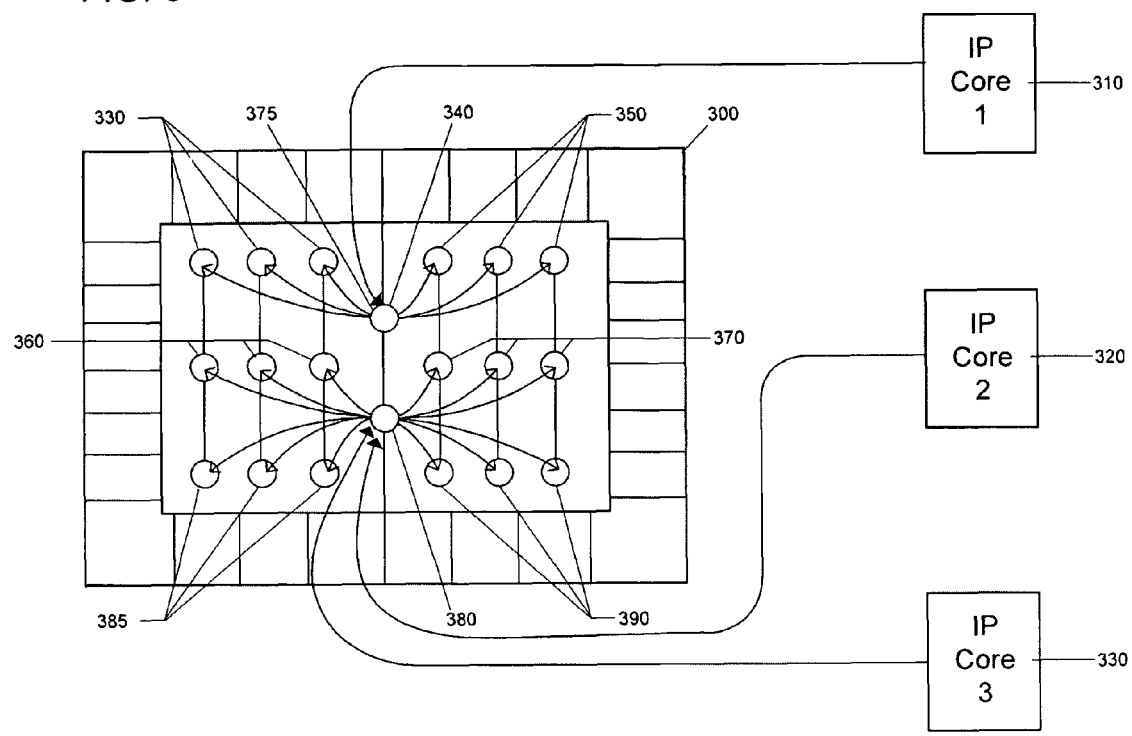
FIG. 3 is a schematic diagram showing the loading sequence of IP cores to an FPGA layer in a 3D IC node.

FIG. 3 shows the loading sequence of IP cores to an FPGA layer in a 3D IC node. IP Core 1 (310) is loaded into the top switch matrix (340). The program code of the IP core is then loaded onto individual logic block arrays (330 and 350). IP Core 2 (320) and IP Core 3 (330) are loaded into the bottom switch matrix (380). The code of IP Core 2 is loaded into the logic block arrays at 360 and 370, while the code of IP Core 3 is loaded into the logic block arrays at 385 and 390.

Figure 4:
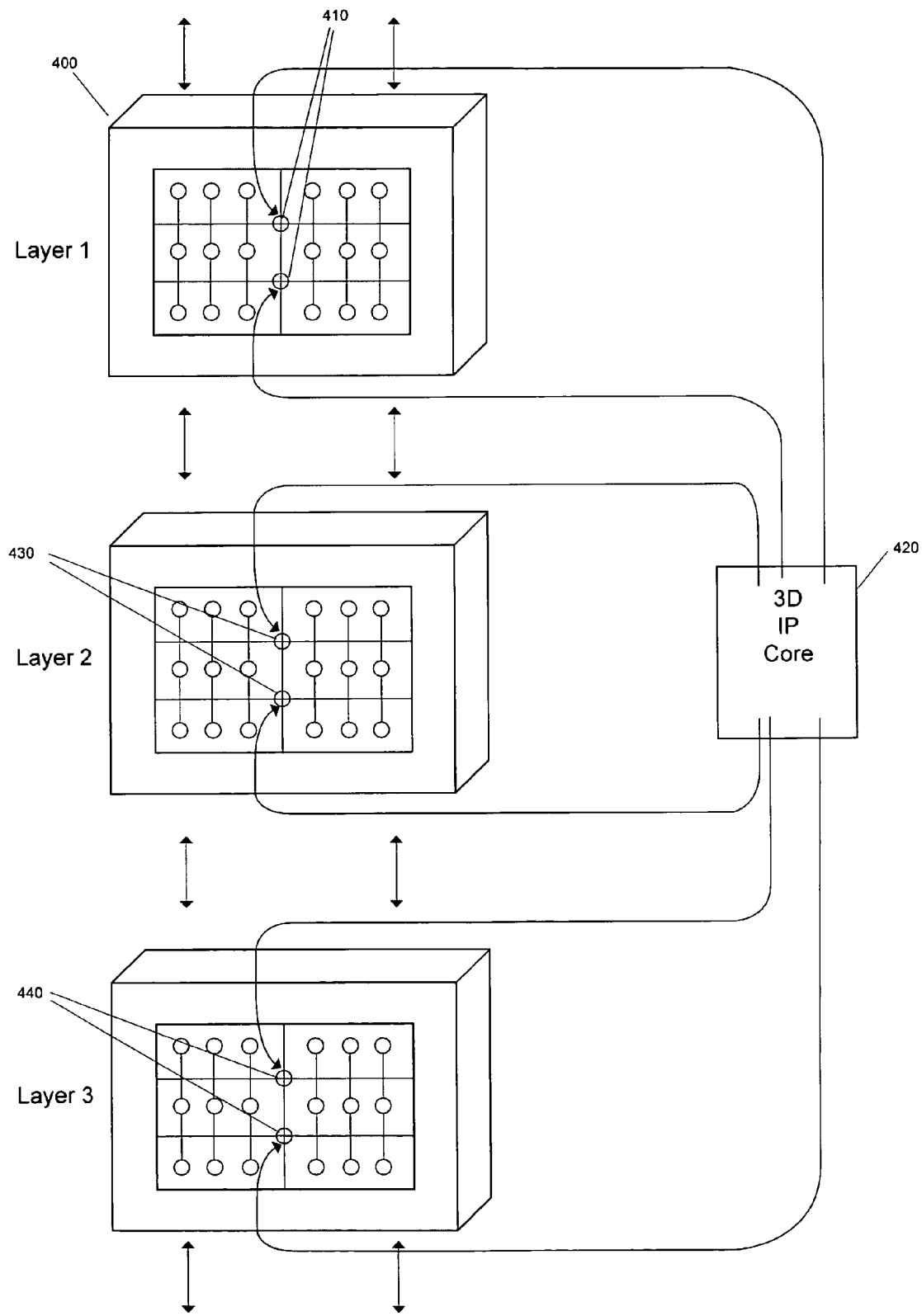
FIG. 4 is a schematic diagram showing a 3D IP core applied to 3 layers of a multilayer FPGA.

FIG. 4 shows a 3D IP core applied to 3 layers of a multilayer FPGA. The 3D IP core (420) is loaded into the switch matrices (410) of Layer one (400), into the switch matrices (430) of Layer two and into the switch matrices (440) of Layer 3. The switch matrices then activate the transformations of the structures of the logic block arrays to perform specific applications or solve specific MOOPs.

Figure 5:
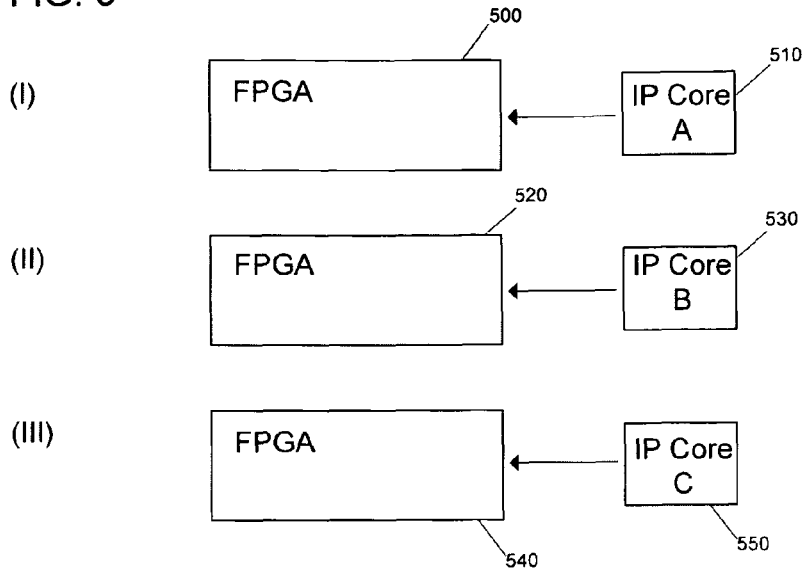
FIG. 5 is a schematic diagram showing three phases of IP core updates to a multilayer FPGA.

FIG. 5 shows three phases of IP core updates to a multilayer FPGA. In phase one, the IP Core A (510) is installed in the FPGA (500). At phase two, the IP Core B (530) is installed in the FPGA (520). Finally, at phase three, the IP Core C (550) is installed in the FPGA (540). This process of updating the FPGA with multiple IP cores allows the sequential evolution of FPGA architecture.

Figure 6:
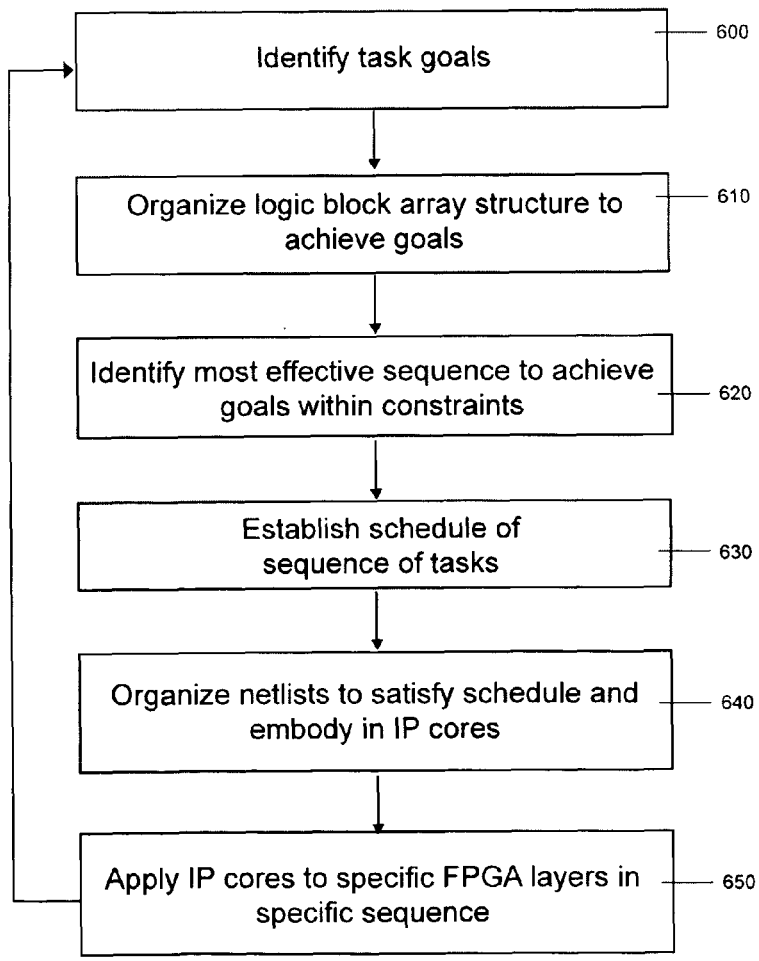
FIG. 6 is a flow chart showing the application of IP cores to an FPGA.

FIG. 6 is a flow chart showing the application of IP cores to an FPGA. After identifying task goals (600), logic block array structures are organized to achieve goals (610). The most effective sequence is identified to achieve goals within constraints (620) and a schedule of the sequence tasks is established (630). Netlists are organized to satisfy the schedule and embodied in IP cores (640), which are applied to specific FPGA layers in a specific sequence (650). The system then repeats by identifying new goals.

Figure 7:
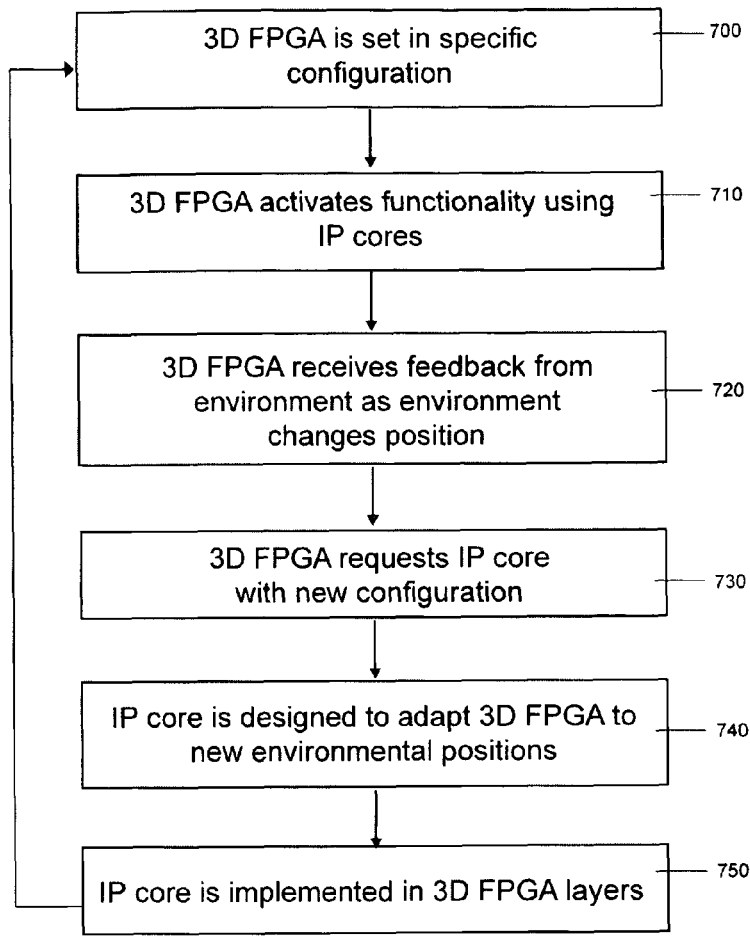
FIG. 7 is a flow chart showing the use of IP cores in a 3D FPGA.

FIG. 7 is a flow chart showing the use of IP cores in a 3D FPGA. Once the 3D FPGA is set in a specific configuration (700), it activates functionality using IP cores (710). The 3D FPGA receives feedback from its environment as the environment changes position (720) and requests an IP core with a new configuration (730). The IP core is designed to adapt the 3D FPGA to new environmental positions (740) and the TP core is implemented in the 3D FPGA layers (750). The system then repeats this process as it continuously co-evolves with the evolving environment.

Figure 8:
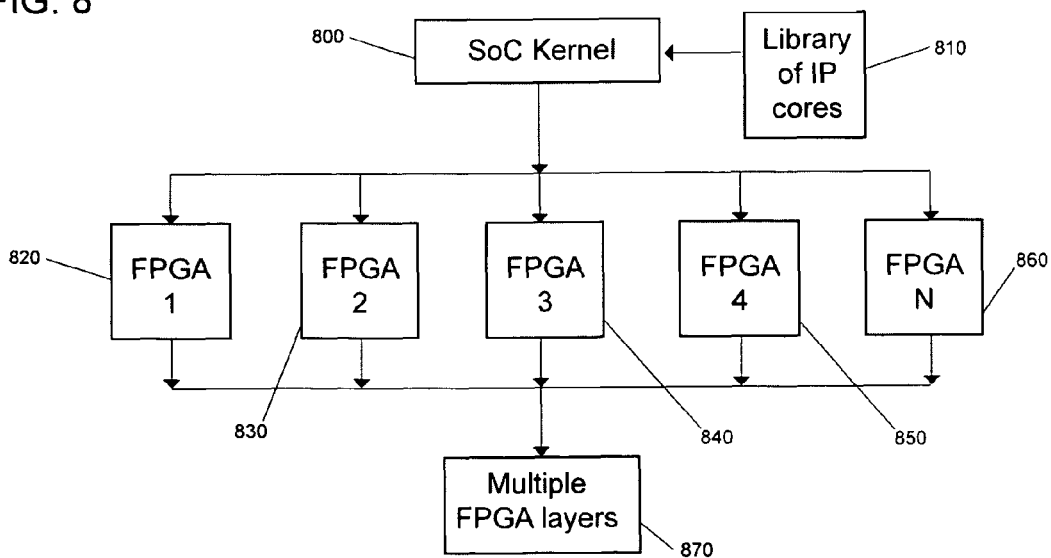
FIG. 8 is a schematic diagram showing FPGA layers in multiple FPGAs within a SoC as programmed from an IP core library.

FIG. 8 shows FPGA layers in multiple FPGAs within a SoC as programmed from an IP core library. The library of IP cores (810) forwards an SoC kernel (800) to multiple FPGAs (820, 830, 840, 850 and 860) which use the IP cores to transform multiple specific FPGA layers (870).

Figure 9:
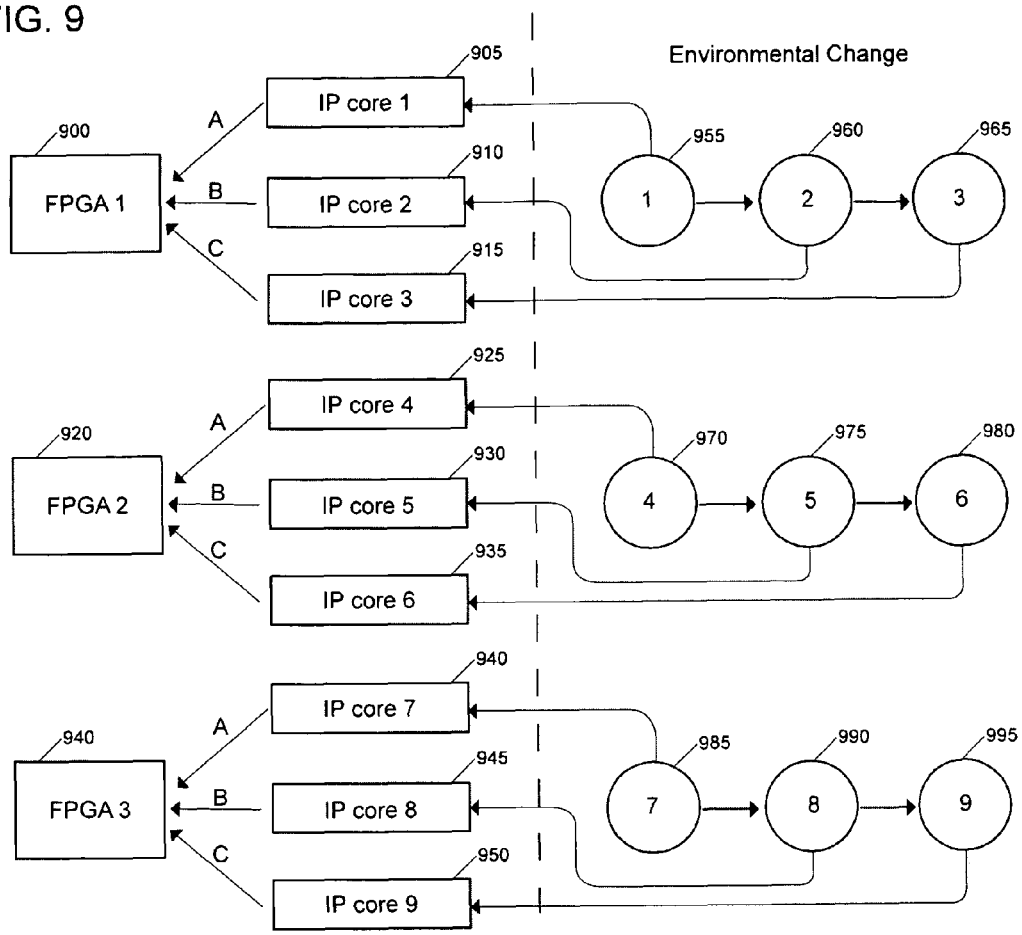
FIG. 9 is a schematic diagram showing how FPGA layers transform from IP core interaction with an evolving environment.

FIG. 9 shows how FPGA layers transform from IP core interaction with an evolving environment. In the first phase, the environment shown at the right experiences a set of changes from position 1 (955) to 2 (960) to 3 (965). These evolutionary phases of the changing environment activate the generation of IP core 1 (905), IP core 2 (910) and IP core 3 (915), which are applied in sequence to FPGA 1 (900). FPGA 1 then proceeds to engage in a sequence of transformations of its hardware configuration. In the second phase, the environment experiences additional changes from position 4 (970) to 5 (975) to 6 (980), which activate the generation of IP core 4 (925), IP core 5 (930) and IP core 6 (935), which are applied in sequence to FPGA 2 (920). FPGA 2 then proceeds to engage in a sequence of transformations of its hardware configuration. In the third phase, the environment experiences additional changes from position 7 (985) to 8 (990) to 9 (995), which activate the generation of IP core 7 (940), IP core 8 (945) and IP core 9 (950), which are applied in sequence to FPGA 3 (940). FPGA 3 then proceeds to engage in a sequence of transformations of its hardware configuration. In one embodiment of the system, these co-evolutionary processes occur with the FPGAs simultaneously.

Figure 10:
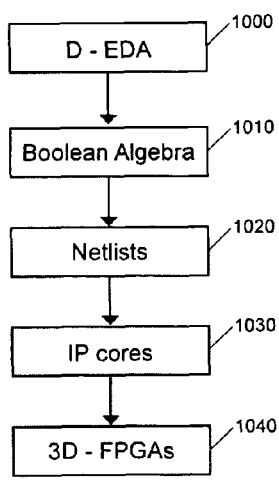
FIG. 10 is a flow chart showing the use of EDA to organize IP cores for use in 3D FPGAs.

FIG. 10 shows the use of EDA to organize IP cores for use in 3D FPGAs. The dynamic EDA modeling process (1000) uses Boolean algebra (1010) to organize netlists (1020) to customize IP cores (1030) to configure and activate 3D FPGAs (1040).

Figure 11:
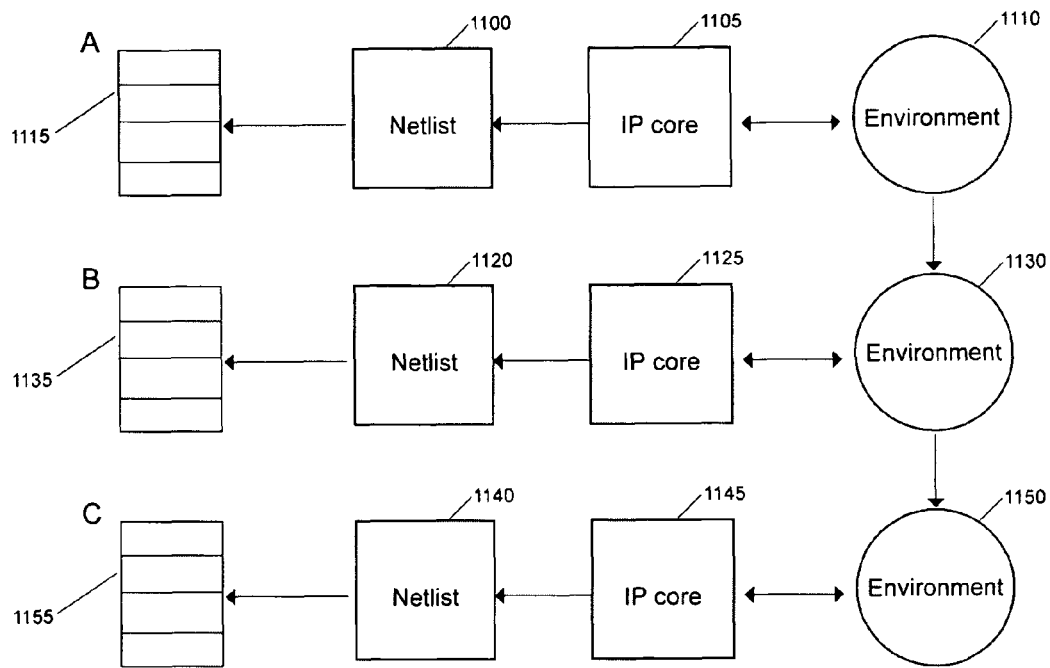
FIG. 11 is a schematic diagram showing the process of continuously updating a netlist from IP cores that interact with an evolving environment.

FIG. 11 shows the process of continuously updating a netlist from IP cores that interact with an evolving environment. In phase A, the environment (1110) interaction generates an IP core (1105) to produce a netlist (1100) to apply to an FPGA layer in a multilayer logic IC. This process repeats with phases two and three.

Figure 12:
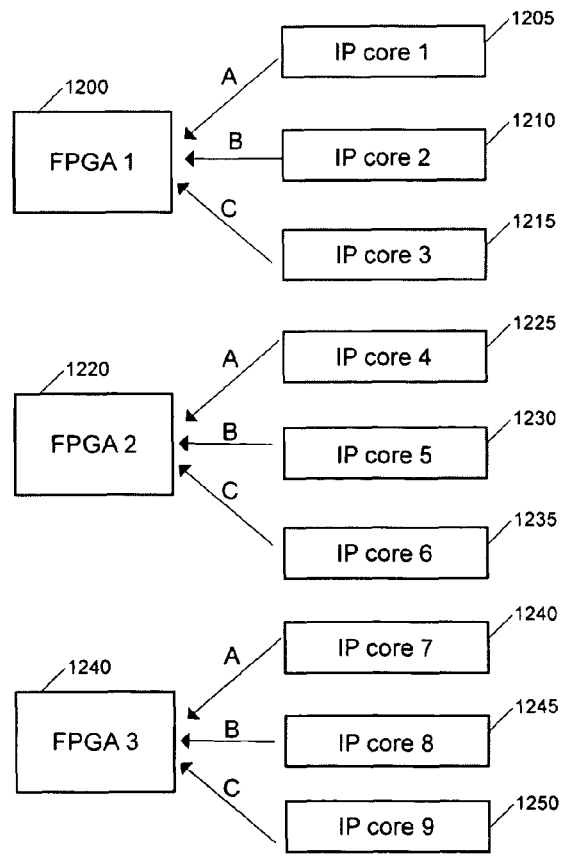
FIG. 12 is a schematic diagram showing the use of a set of IP cores by three layers of FPGAs in a 3D FPGA over time.

FIG. 12 shows the use of a set of IP cores by three layers of FPGAs in a 3D FPGA over time. IP cores 1 (1205), 2 (1210) and 3 (1215) are installed FPGA 1 (1200), followed by IP cores 4 (1225), 5 (1230) and 6 (1235) installed in FPGA 2 (1220) and IP cores 7 (1240), 8 (1245) and 9 (1250) in FPGA 3 (1240). The sequential activation of the FPGA layers in a multilayer FPGA allows the system to continue to operate while some of the logic block arrays are restructuring to maintain maximum performance and minimize down time.

Figure 13:
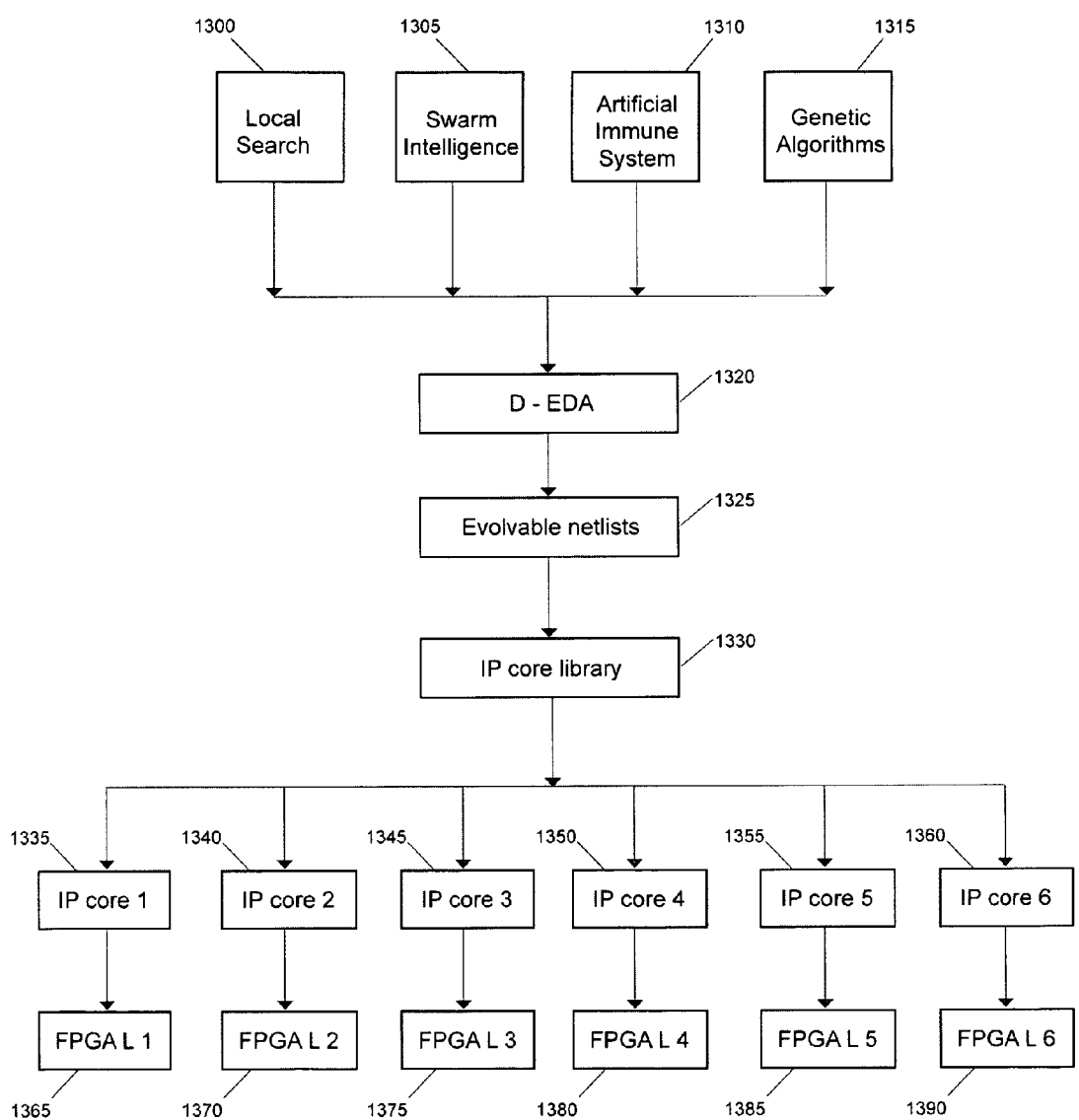
FIG. 13 is a schematic diagram illustrating the use of metaheuristic algorithms applied to IP cores and to FPGA layers in a 3D FPGA.

FIG. 13 shows the use of metaheuristics algorithms applied to IP cores and to FPGA layers in a 3D FPGA. The four main types of metaheuristic algorithms specified are local search (1300), swarm intelligence (1305), artificial immune system (1310) and genetic algorithms (1315). Hybrid combinations of examples of these metaheuristic categories are constructed into application oriented algorithms which are translated into the modeling format for specific hardware configurations by the D-EDA (1320) process, which structures evolvable netlists (1325) for each application. The netlists provide the constraints for the IP core components that are combined to form customized IP cores generated by the IP core library (1330). These IP cores (1335, 1340, 1345, 1350, 1355 and 1360) are then applied to specific FPGA layers (1-6) (1365, 1370, 1375, 1380, 1385 and 1390).

Figures 14, 15:
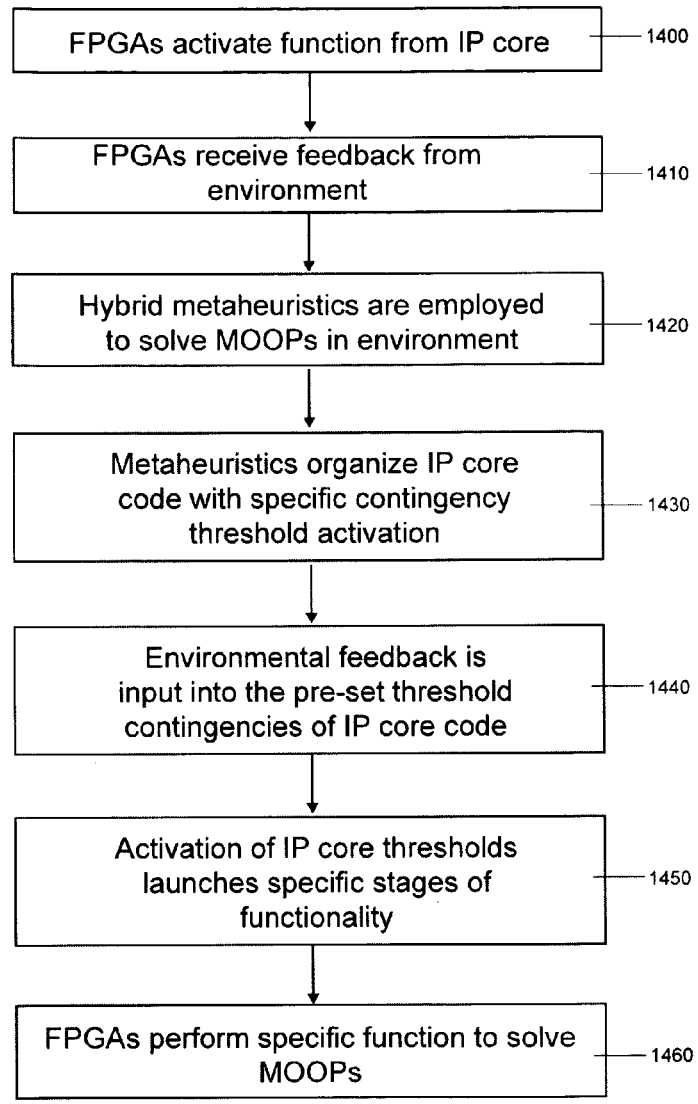
FIG. 14 is a flow chart showing the use of metaheuristics applied to solve MOOPs and to organize an activation threshold in 3D FPGAs.
FIG. 15 is a table showing the IP core typology for use in a 3D FPGA.

FIG. 14 is a flow chart showing the use of metaheuristics applied to solve MOOPs to organize an activation threshold in 3D FPGAs. After FPGAs activate a function from an IP core (1400), they receive feedback from the environment (1410). Hybrid metaheuristics are employed to solve MOOPs in the environment (1420) and to organize IP core program code within specific contingency threshold activation (1430). The environmental feedback is input into the pre-set threshold contingencies of IP core code (1440) and activation of IP core thresholds launches specific stages of functionality (1450). The FPGAs then perform a specific function to solve MOOPs (1460).

FIG. 15 shows an IP core typology for use in a 3D FPGA. IP cores configure an FPGA to a specific ASIC structure. These ASIC structures are useful in DSP, embedded computing and multi-functional applications. The FPGAs oscillate between ASIC positions to respond to an evolving environment in order modulate hardware structure to solve MOOPs.

An IP core library stores multiple IP cores and IP core elements. The IP core library organizes different IP core elements and combines the IP core elements in different combinations to solve specific MOOPs and apply the unique combinations to FPGAs at specific times. The IP core elements are constantly reaggregated so as to maintain efficiency and reusability of IP core components. The IP cores are organized according to multiple variables for rapid access and application to specific classes of MOOPs.

Figure 16:
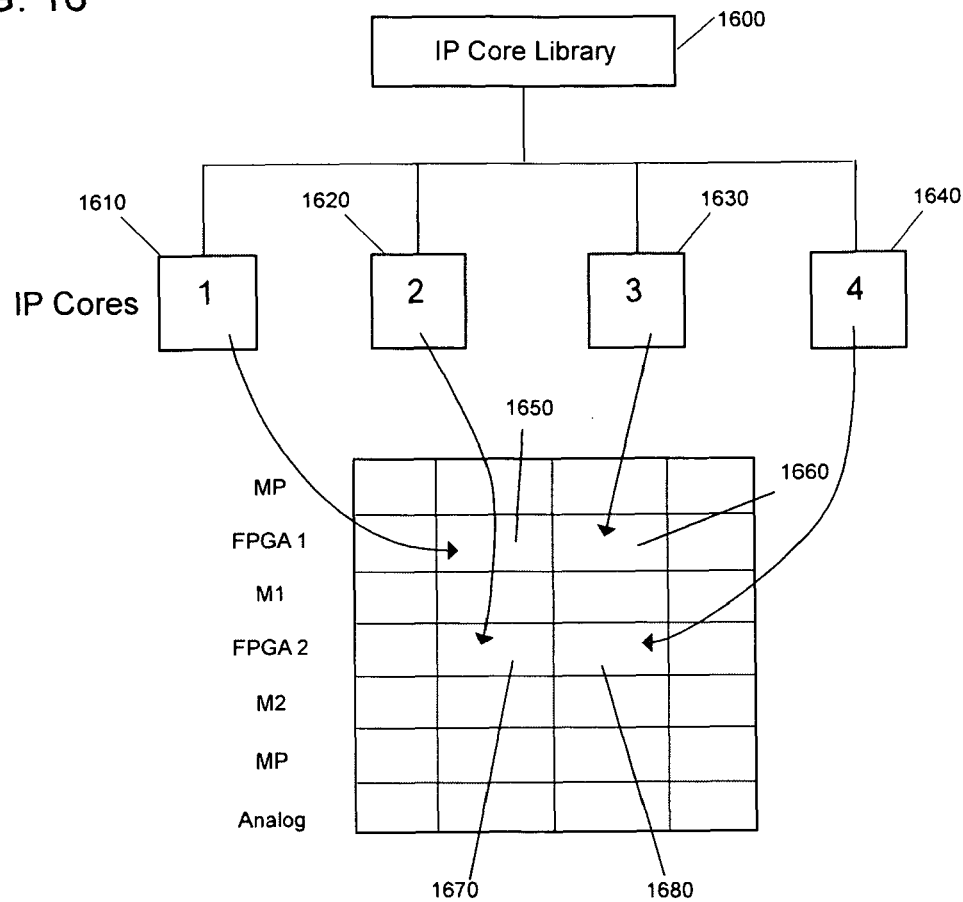
FIG. 16 is a schematic diagram showing the use of an IP core library to apply several IP cores to FPGA layers in a multilayer hybrid IC.

FIG. 16 shows the use of an IP core library to apply several IP cores to FPGA layers in a multilayer hybrid IC. The IP core library generates four IP cores (1610, 1620, 1630 and 1640), which are forwarded to activate the transformations of specific logic block arrays on tiles of FPGA layers at FPGA 1 (1650 and 1660) from IP cores 1 and 2 and FPGA 2 (1670 and 1680).

Figure 17:
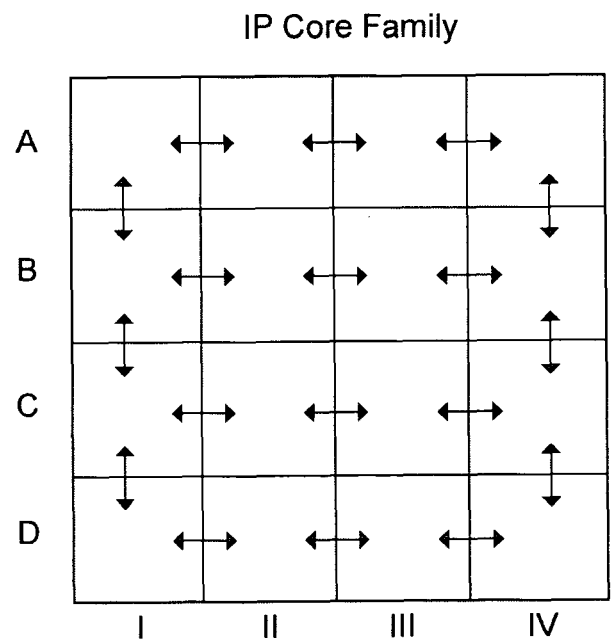
FIG. 17 is a schematic diagram showing the relationships of IP core family components.

FIG. 17 shows the relationships of IP core family components. Each IP core refers to a specific class of problems or applications. The problems and applications are categorized according to a typology. The problems and applications are related to other categories of problems and applications. In the figure, the class of problems or applications at A, B, C and D are related to adjoining problems or applications.

Figure 18:
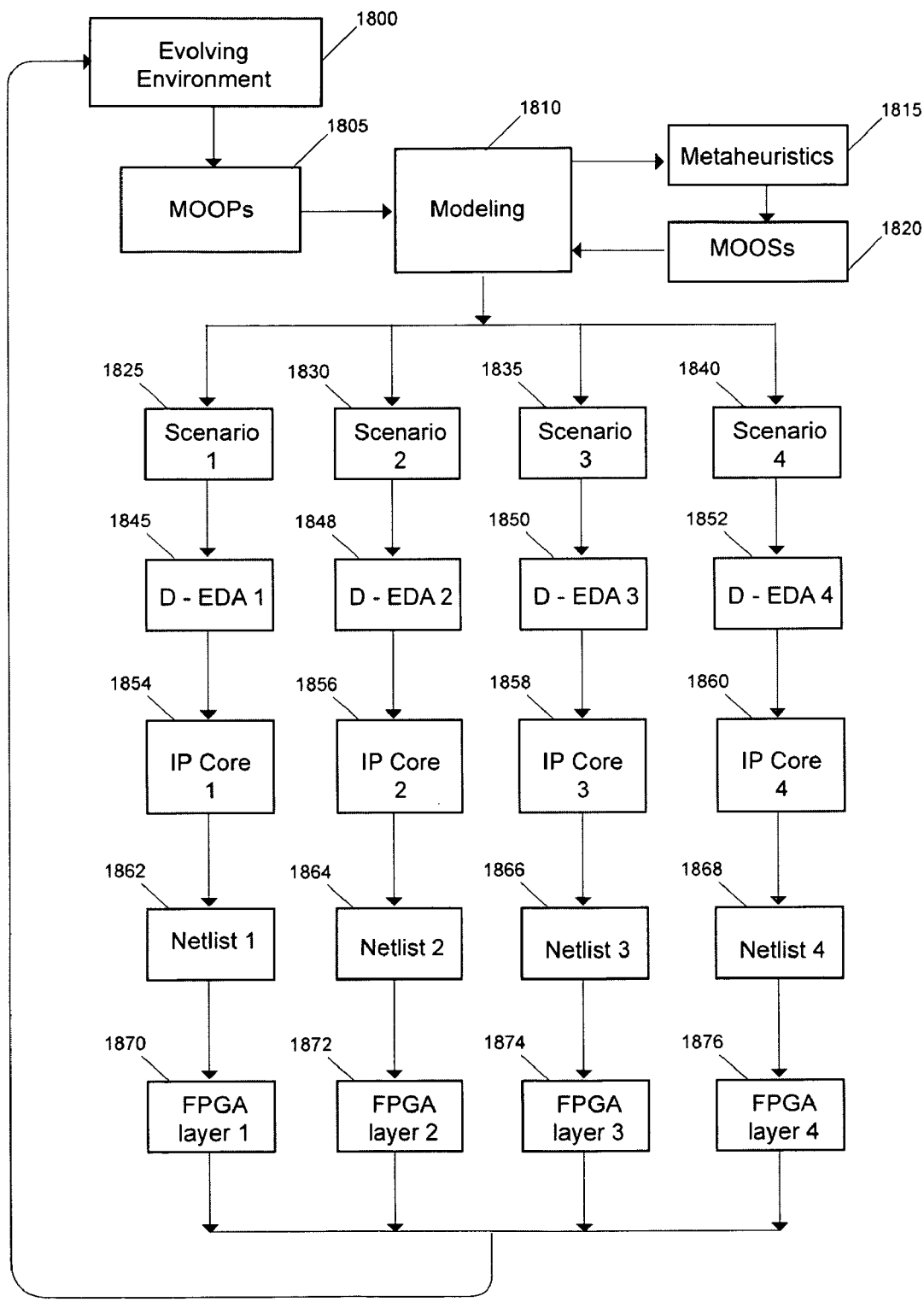
FIG. 18 is a flow chart showing the process of modeling multiple scenarios and applying IP cores to several FPGA layers in a multilayer FPGA.

FIG. 18 is a flow chart showing the process of modeling multiple scenarios and applying IP cores to several FPGA layers in a multilayer FPGA. From an evolving environment (1800), MOOPs (1805) are identified. The MOOPs require modeling (1810) in order to solve, which require metaheuristics (1815). The metaheuristics generate MOOS options (1820), which continue to be refined by the modeling and metaheuristics process. The modeling process then generates multiple scenarios (1825, 1830, 1835 and 1840). From the different scenarios, several D-EDA models are constructed (1845, 1848, 1850 and 1852). The EDA models generate multiple IP cores (1854, 1856, 1858 and 1860), which in turn produce corresponding netlists (1862, 1864, 1866 and 1868). The IP cores, along with the netlists, are then installed into specific FPGA layers (1870, 1872, 1874 and 1876), which then engage in transforming their hardware structures to specific configurations. The FPGA layers then perform their reconfigured applications, which interact with the evolving environment and the process repeats.

Figure 19:
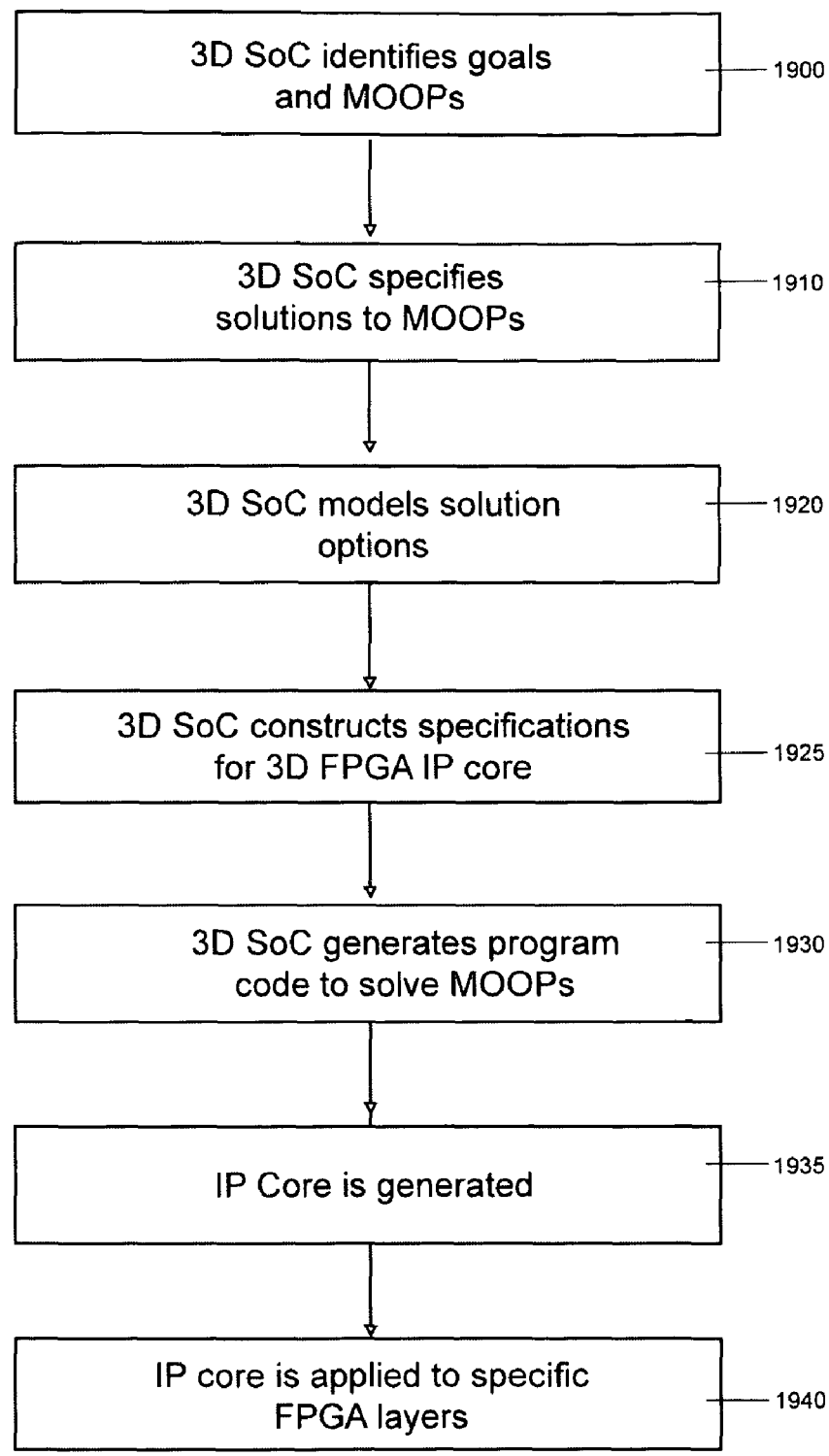
FIG. 19 is a flow chart showing the process of reverse engineering IP cores for a 3D SoC.

FIG. 19 is a flow chart showing the process of reverse engineering IP cores for a 3D SoC. The 3D SoC identifies goals (1900) and specifies solutions (1910) to MOOPs. The 3D SoC then models solution options (1920) and constructs specifications for 3D FPGA IP cores (1925). The 3D SoC generates programs code to solve MOOPs (1930) and an IP core is generated (1935) and applied to specific FPGA layers (1940).

Figure 20:
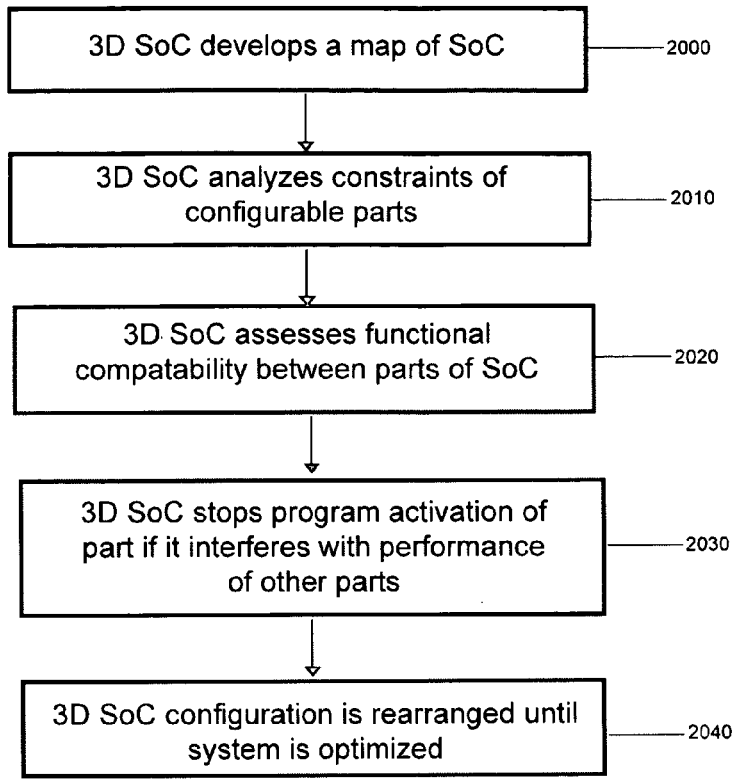
FIG. 20 is a flow chart showing the 3D SoC configuration compatibility organization.

FIG. 20 is a flow chart showing the 3D SoC configuration compatibility organization. After the 3D SoC develops a map of the SoC (2000), it analyzes constraints of configurable parts (2010). The 3D SoC then assesses functional compatibility between parts of the SoC (2020) and stops activation of part of the SoC if it interferes with the performance of other parts (2030). The 3D SoC configuration is then rearranged until the system is optimized (2040). This process prevents conflicts in the system, much like enzymes are used in the cell to prevent protein conflicts.

Figure 21:
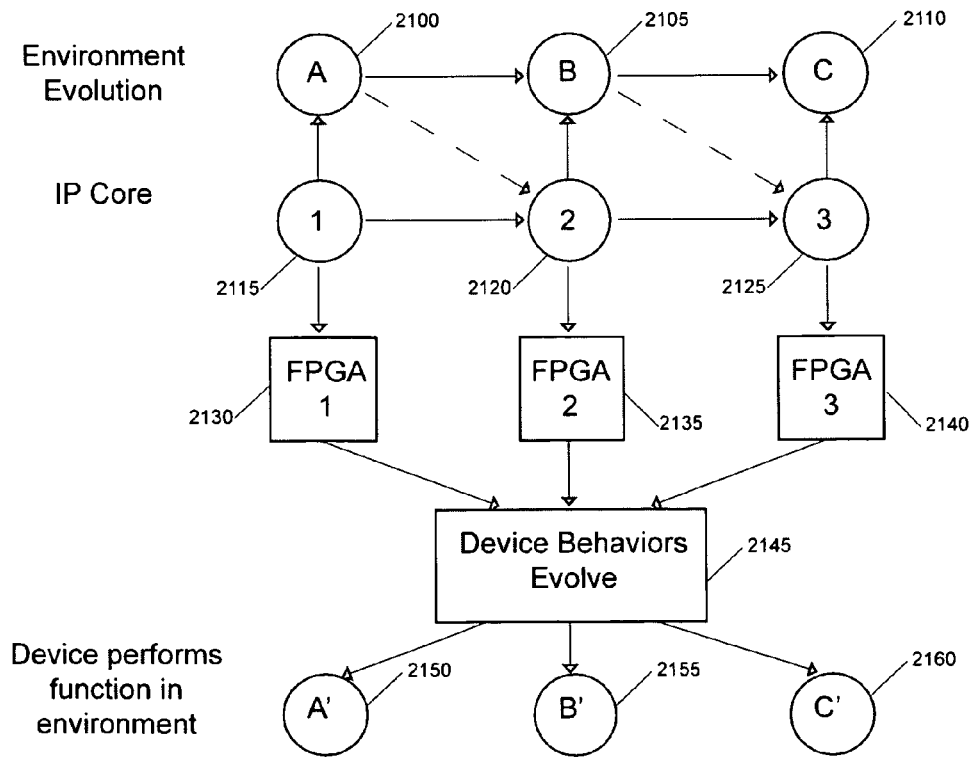
FIG. 21 is a schematic diagram showing the co-evolution of reprogrammable IP cores and 3D FPGA layers.

FIG. 21 shows the co-evolution of reprogrammable IP cores and 3D FPGA layers. As the environment evolves to different phases (A, B and C) (2100, 2105 and 2110), multiple IP cores (1, 2 and 3) (2115, 2120 and 2125) interact with the environment in a reactive delay, with the successive IP core interacting with the previous environmental position. The IP cores are then installed into specific FPGAs (2130, 2135 and 2140) and the device behaviors evolve (2145) as they perform specific functions in the environment (2150, 2155 and 2160).

Figures 22, 23:
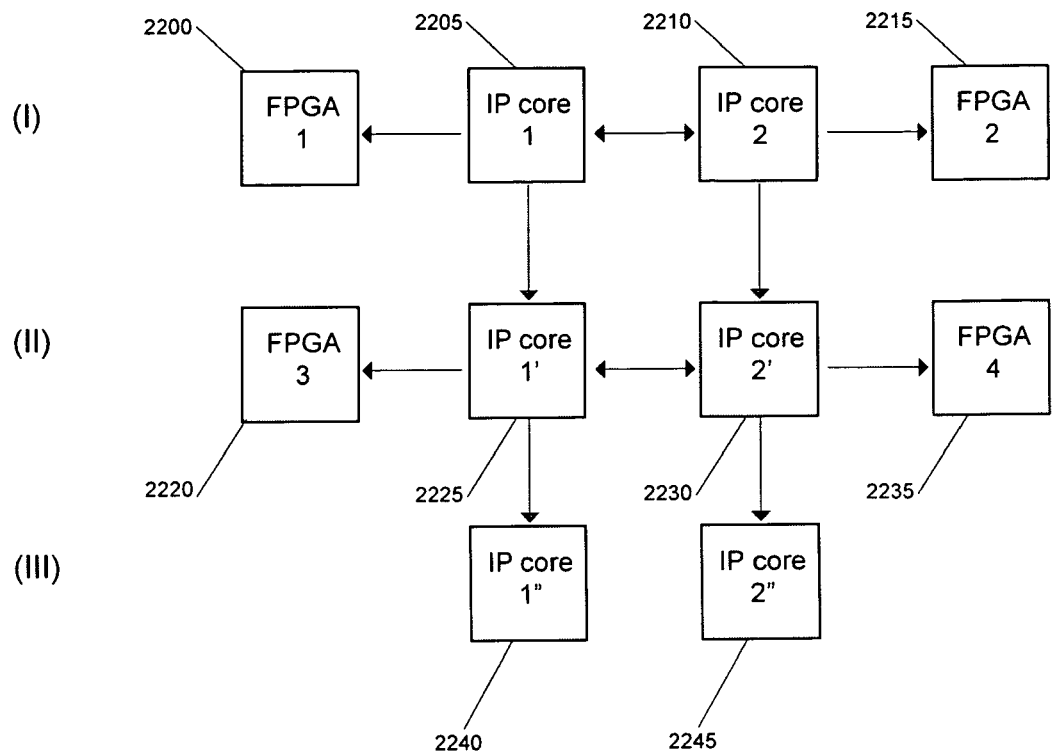
FIG. 22 is a schematic diagram showing the IP core interactions and evolution over several phases.
FIG. 23 is a table showing IP core and FPGA types.

FIG. 22 shows the IP core interactions and evolution over several phases. As the four FPGAs (1, 2, 3 and 4) (2200, 2215, 2220 and 2235) interact with their environment, the IP cores (1, 2, 1', 2', 1" and 2") that activate their reconfigurations are interacting with each other as well as evolving. The IP cores 1 and 2 (2205 and 2210) interact with each other, but as they receive feedback from a changing environment that requires them to evolve to new positions at 1' and 2', respectively, they modify the configuration of FPGAs 3 and 4. This process repeats as the IP cores interact with an evolving environment to solve MOOPs.

FIG. 23 shows IP core and FPGA types. The IP cores correspond to the category of FPGA employed. Single use IP cores are used in deterministic situations. In indeterministic situations, IP cores are reused in programmable FPGAs. In continuously reprogrammable situations, adaptive IP cores are used with evolvable, and reaggregating, IP core elements. This latter group is useful in solving MOOPs in co-evolutionary environments.

Figures 24, 25:
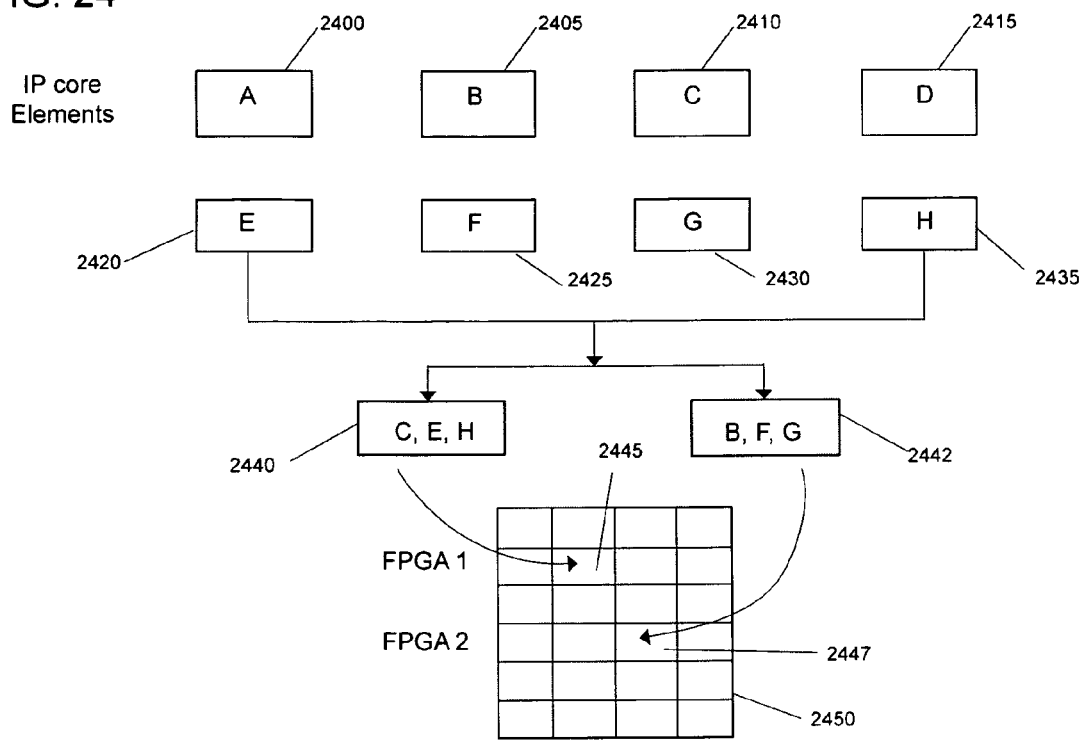
FIG. 24 is a schematic diagram showing IP core elements combined into IP cores for application to a multilayer FPGA.
FIG. 25 is a table showing the use of reusable IP core elements over several phases applied to multiple FPGA layers in a multilayer FPGA.

FIG. 24 shows IP core elements combined into IP cores for application to a multilayer FPGA. The IP core elements—A, B, C, D, E, F, G and H—from the library are combined in specific unique configurations, CEH (2440) and BFG (2442) and installed at FPGA layer 1, tile 2 (2445), and FPGA 2, tile 3 (2447), respectively. The combination of specific IP core elements into unique configurations provides for the rapid development of solutions to MOOPs that have arisen in the past and which require slight modifications of known solutions that have been stored in the library.

FIG. 25 shows the use of reusable IP core elements over several phases applied to multiple FPGA layers in a multi-layer FPGA. The IP core elements, shown on the left (A-H) are activated in combination during specific phases. In the first phase, A, C, D and F are combined. In the second phase, A, B, D and G are combined. In the third phase, C, D, E and F are combined. In the fourth phase, A, C, D, G and H are combined.

Figures 26, 27:
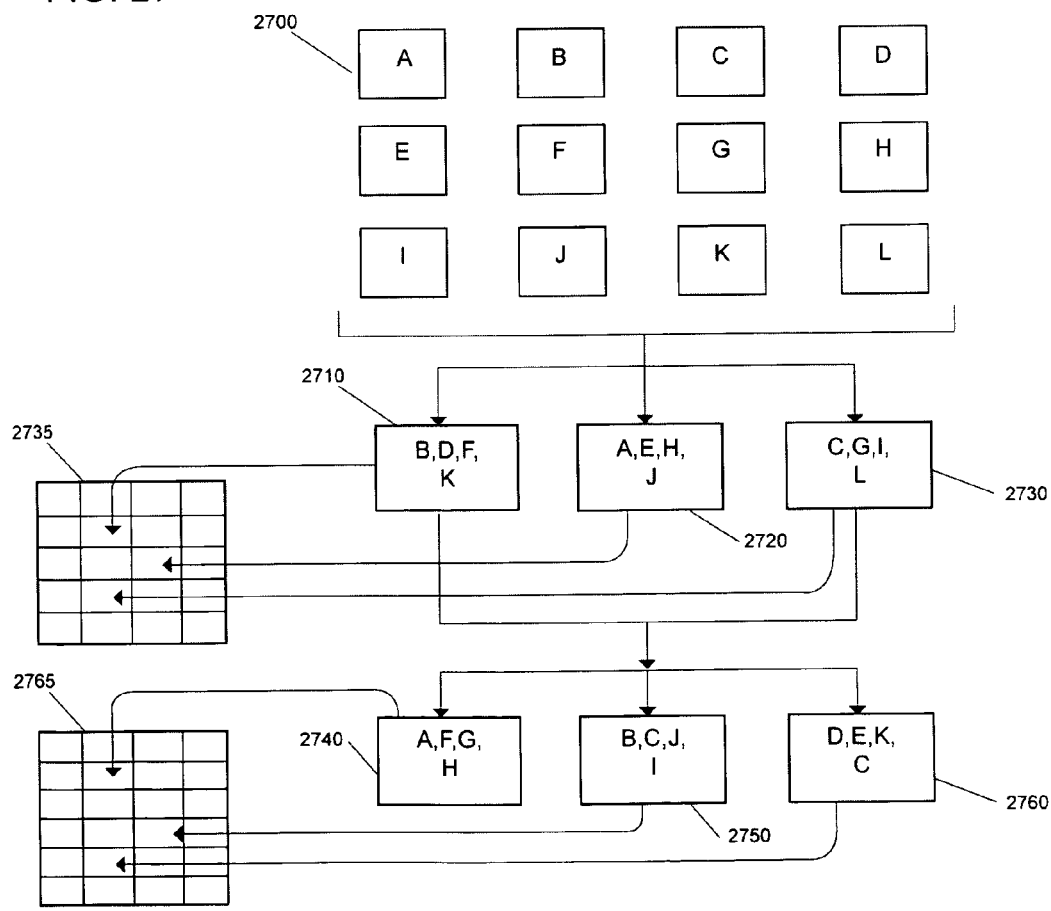
FIG. 26 is a table showing the use of IP core elements organized by category.
FIG. 27 is a schematic diagram showing the recombination of IP cores and application of reaggregated IP cores to 3D FPGAs.

FIG. 26 shows the use of IP core elements organized by category for specific applications. For DAC/ADC structure, the IP core elements combine A, B, C, D and E. For image sensor structures, they combine F, G, H and I. For MAC structures, they combine J, K and L. For ATSC protocols, they form M, N, O and P. For wireless protocols, they combine Q, R, S, T and U. For embedded controller protocols, they combine U, W, X, Y and Z. For multifunctional structures, they will combine several types of IP core elements for multiple applications.

FIG. 27 shows the recombination of IP cores and the application of reaggregated TP cores to 3D FPGAs. The IP core library contains IP core elements A-L (2700). Several unique combinations of these IP core elements are organized as B, D, F and K (2710), A, E, H and J (2720) and C, G, I and L (2730), which are applied to specific FPGA layer tiles (2735) for activation. In a later phase of development, the IP core elements are rearranged and recombined into unique configurations to solve another set of MOOPs for other applications: A, F, G and H (2740), B, C, J and I (2750) and D, E, K and C (2760), which are applied to specific FPGA layer tiles (2765) for activation.

Figure 28:
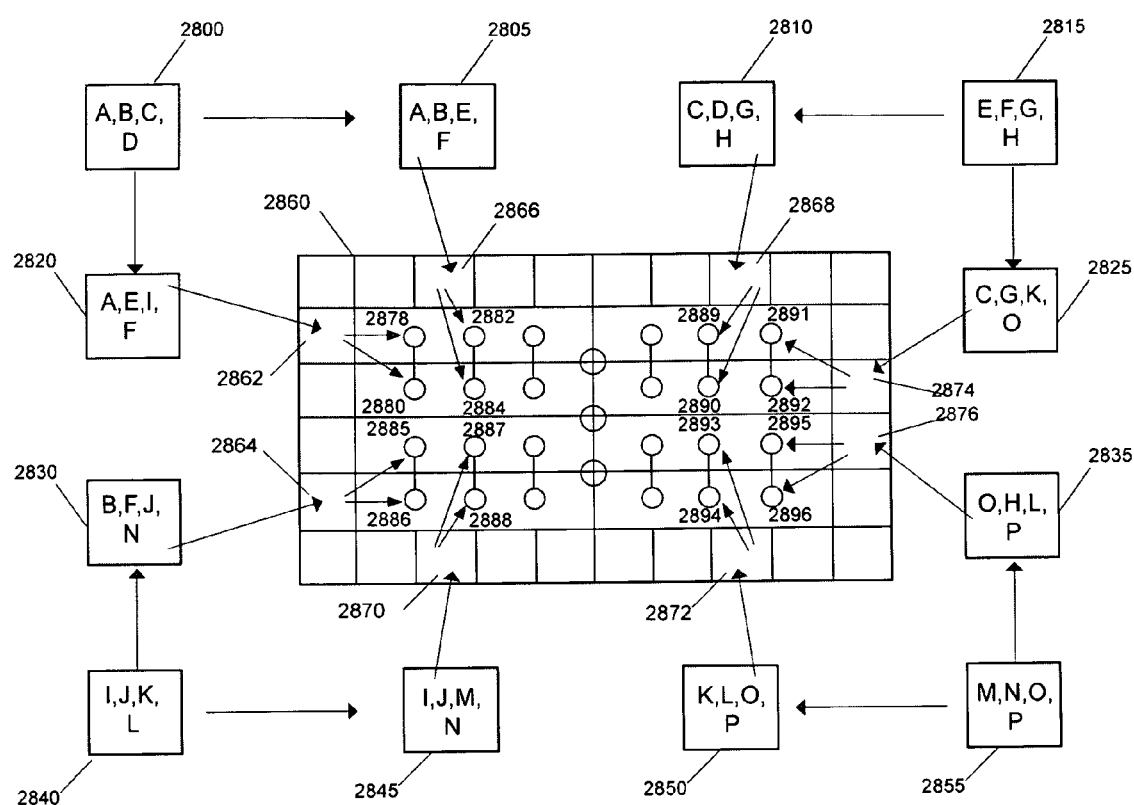
FIG. 28 is a schematic diagram showing reaggregated IP core elements applied to an FPGA layer.

FIG. 28 shows reaggregated IP core elements applied to an FPGA layer. After initially being configured as A, B, C and D (2800), the IP core elements are reconfigured into A, B, E and F (2805) and into A, E, I and F (2820). These IP core element reaggregated combinations are then forwarded to the memory tiles (2866 and 2862, respectively) for passing to the logic block arrays (2882/2884 and 2878/2880, respectively) for activation. The IP core elements E, F, G and H (2815) are reconfigured into C, D, G and H (2810) and C, G, K and O (2825), which are installed into logic blocks 2889/2890 and 2891/2892, respectively, via memory tiles 2868 and 2874. IP core elements I, J, K and L (2840) are reconfigured into B, F, J and N (2830) and I, J, M and N (2845), which are installed into logic block arrays at 2885/2886 and 2887/2888, respectively, via memory tiles 2864 and 2870. IP core elements M, N, O and P are reconfigured into K, L, O and P (2850) and O, H, L and P (2835), which are installed into logic block arrays at 2893/2894 and 2895/2896, respectively, via memory tiles 2872 and 2876.

Figure 29:
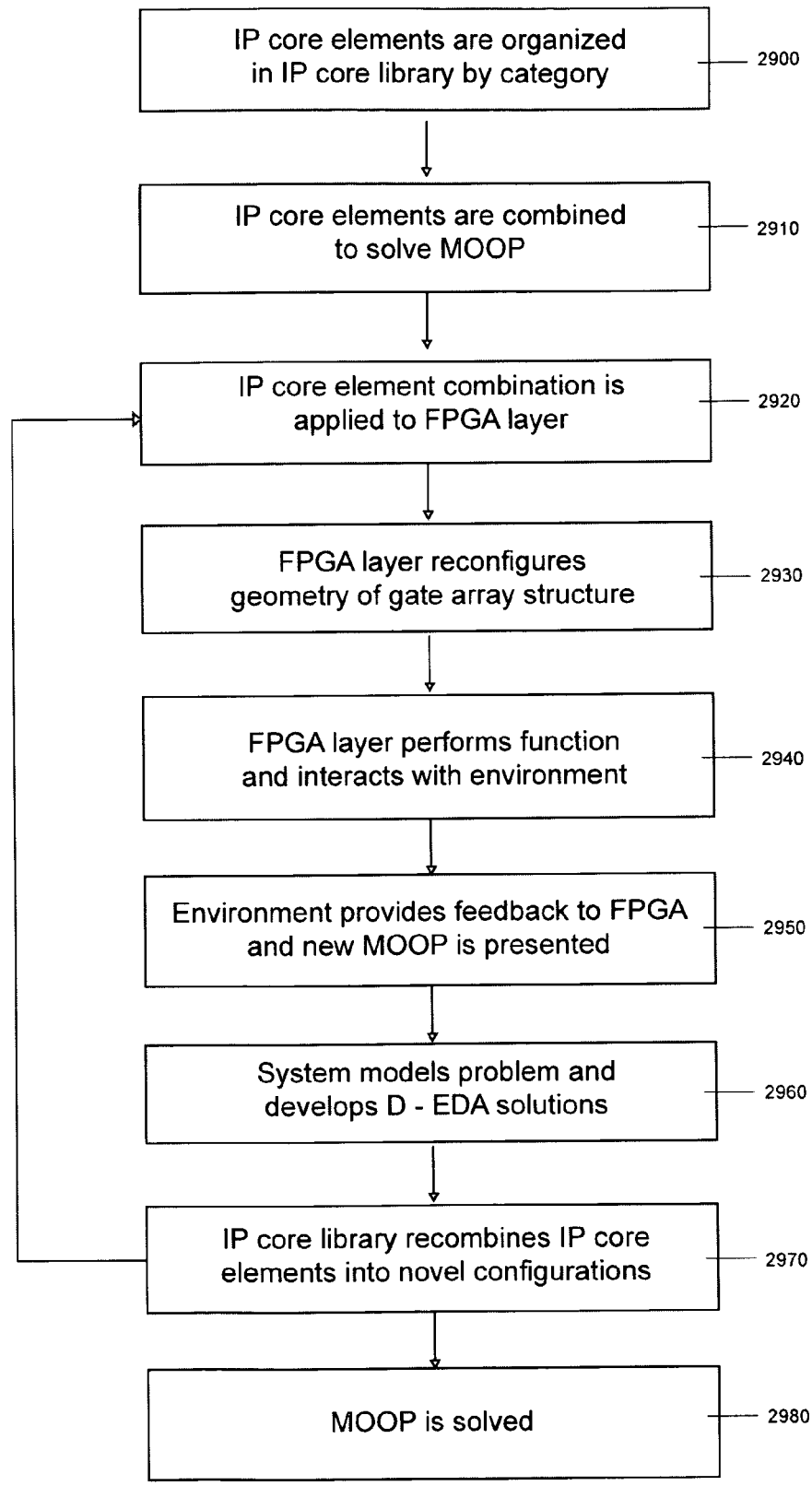
FIG. 29 is a flow chart showing the IP core element reaggregation process applied to a FPGA geometry reconfiguration process.

FIG. 29 is a flow chart showing the IP core element reaggregation process applied to a FPGA geometry reconfiguration process. After the IP core elements are organized in the IP core library by category (2900), they are combined to solve a MOOP (2910). The IP core element combination is applied to an FPGA layer (2920), which reconfigures the geometry of it gate array structure (2930). The FPGA layer performs its function and interacts with the environment (2940), which provides feedback to the FPGA and a new MOOP is presented (2950). The system models the problem and develops D-EDA solutions (2960). The IP core library recombines IP core elements into novel configurations to conform to the D-EDA models (2970) and the system repeats the process of applying IP core element combinations and receiving environmental feedback until the MOOP is solved (2980).

Figure 30:
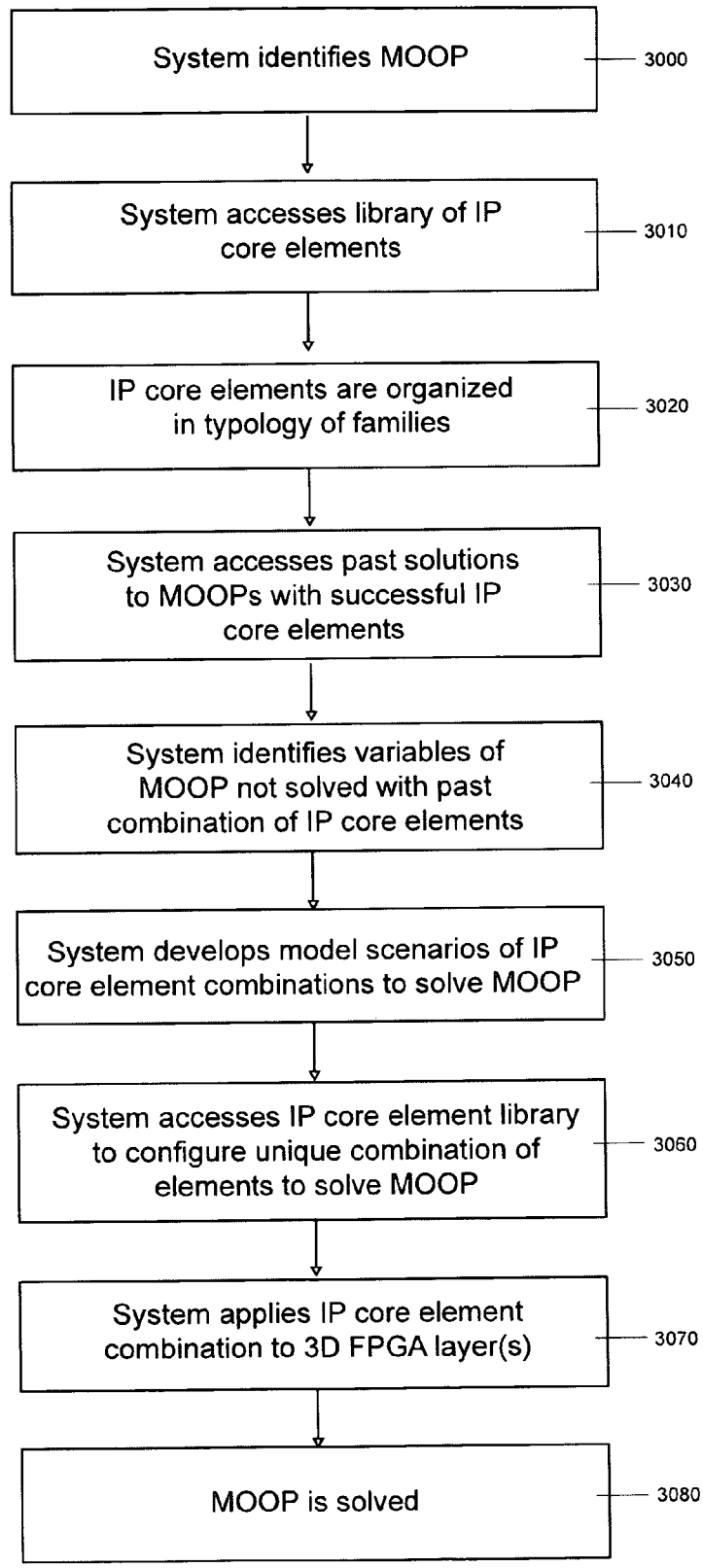
FIG. 30 is a flow chart showing the application of IP core elements to 3D FPGA layers to solve MOOPs.

FIG. 30 is a flow chart showing the application of IP core elements to 3D FPGA layers to solve MOOPs. Once the system identifies a MOOP (3000), the system accesses the library of IP core elements (3010), which are organized in a typology of families (3020). The system then accesses past solutions to MOOPs with successful IP core elements (3030) and identifies variables of a MOOP not solved with a past combination of IP core elements (3040). The system develops model scenarios of IP core element combinations to solve the MOOP (3050) and accesses the IP core element library to configure a unique combination of elements to solve the MOOP (3060). The system applies the IP core element combination to the 3D FPGA layer(s) (3070) and the MOOP is solved (3080) after the FPGA layer(s) are activated.

Figure 31:
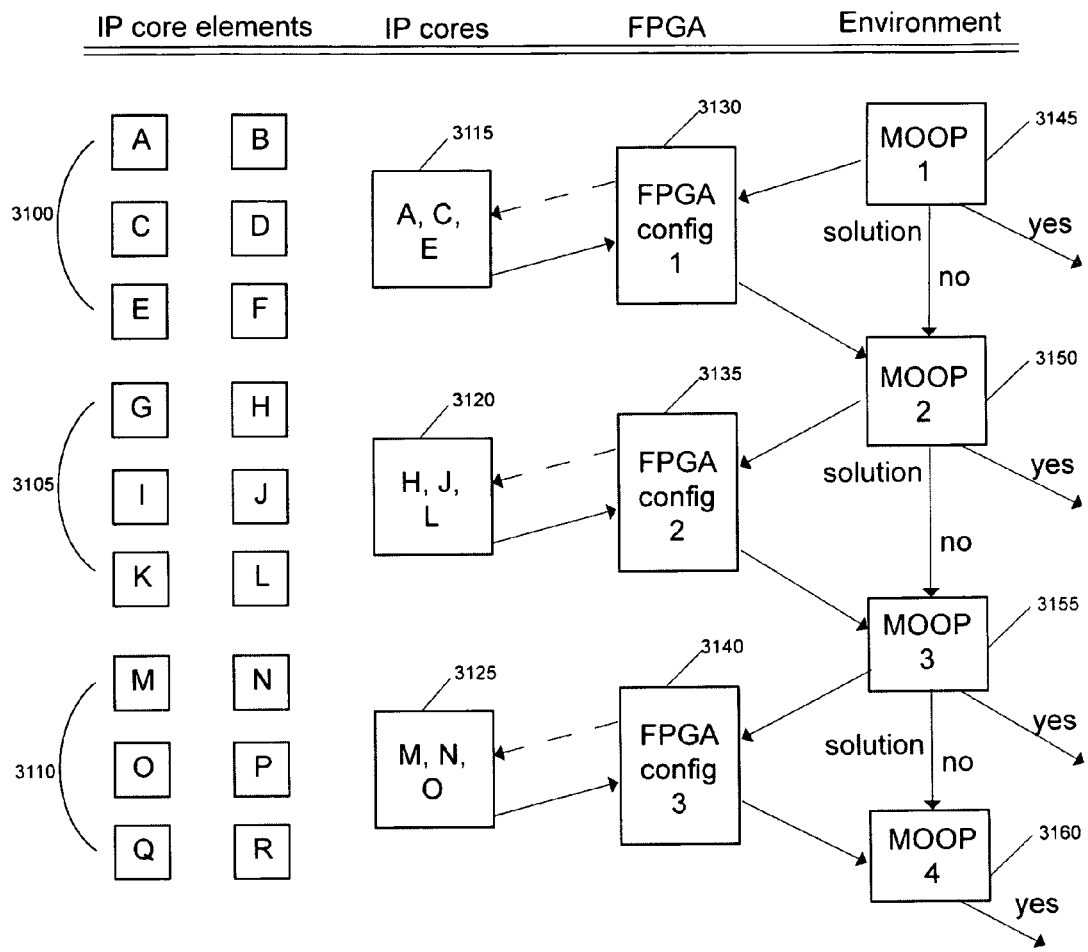
FIG. 31 is a schematic diagram showing the use of IP core element combinations applied to FPGAs to solve changing environmental MOOPs.

FIG. 31 shows the use of IP core element combinations applied to FPGAs to solve changing environmental MOOPs. In the first stage, the environment presents a MOOP (3145) that requires an FPGA configuration 1 (3130). The system accesses the IP core library to assemble the combination of IP core elements (3100) into A, C and E (3115), which are then applied to FPGA configuration 1. If the MOOP is solved, then the process stops. If MOOP 1 is not solved, then it evolves into MOOP 2 (3150), which requires a different FPGA configuration (3135). The system accesses the IP core library to assemble the combination of IP core elements (3105) into H, J and L (3120), which are then applied to FPGA configuration 2 (3135). If MOOP 2 is solved, then the process stops. If MOOP 2 is not solved, then it evolves into MOOP 3 (3155), which requires a different FPGA configuration (3140). The system accesses the IP core library to assemble the combination of IP core elements (3110) into M, N and O (3125), which are then applied to FPGA configuration 3 (3140). The process continues until the evolutionary MOOPs are solved.

Figure 32:
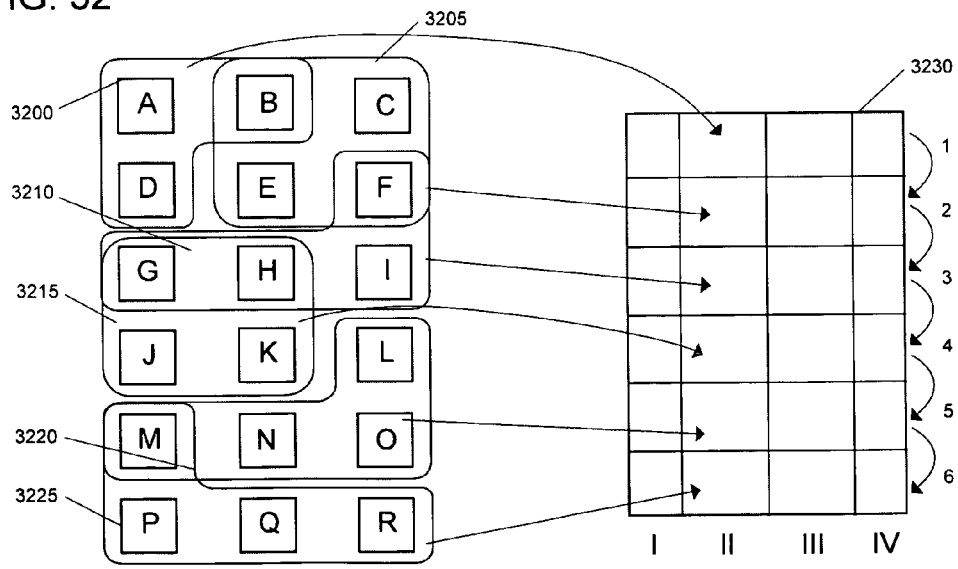
FIG. 32 is a schematic diagram showing the different combinations of IP core elements in a sequence of FPGA layer transformations.

FIG. 32 shows the different combinations of IP core elements in a sequence of FPGA layer transformations. The multilayer FPGA (3230) transforms the configuration of its layers in a sequence from 1 to 6. The IP core elements from the IP core library are configured into unique combinations as shown on the left. A, B and D (3200) are applied at layer 1 initially. C and E (3205) are applied at layer 2. I is applied at layer 3. G, H, J and K (3215) are applied at layer 4. L, N and O (3220) are applied at layer 4. M, P, Q and R (3225) are applied at layer 6.

Figure 33:
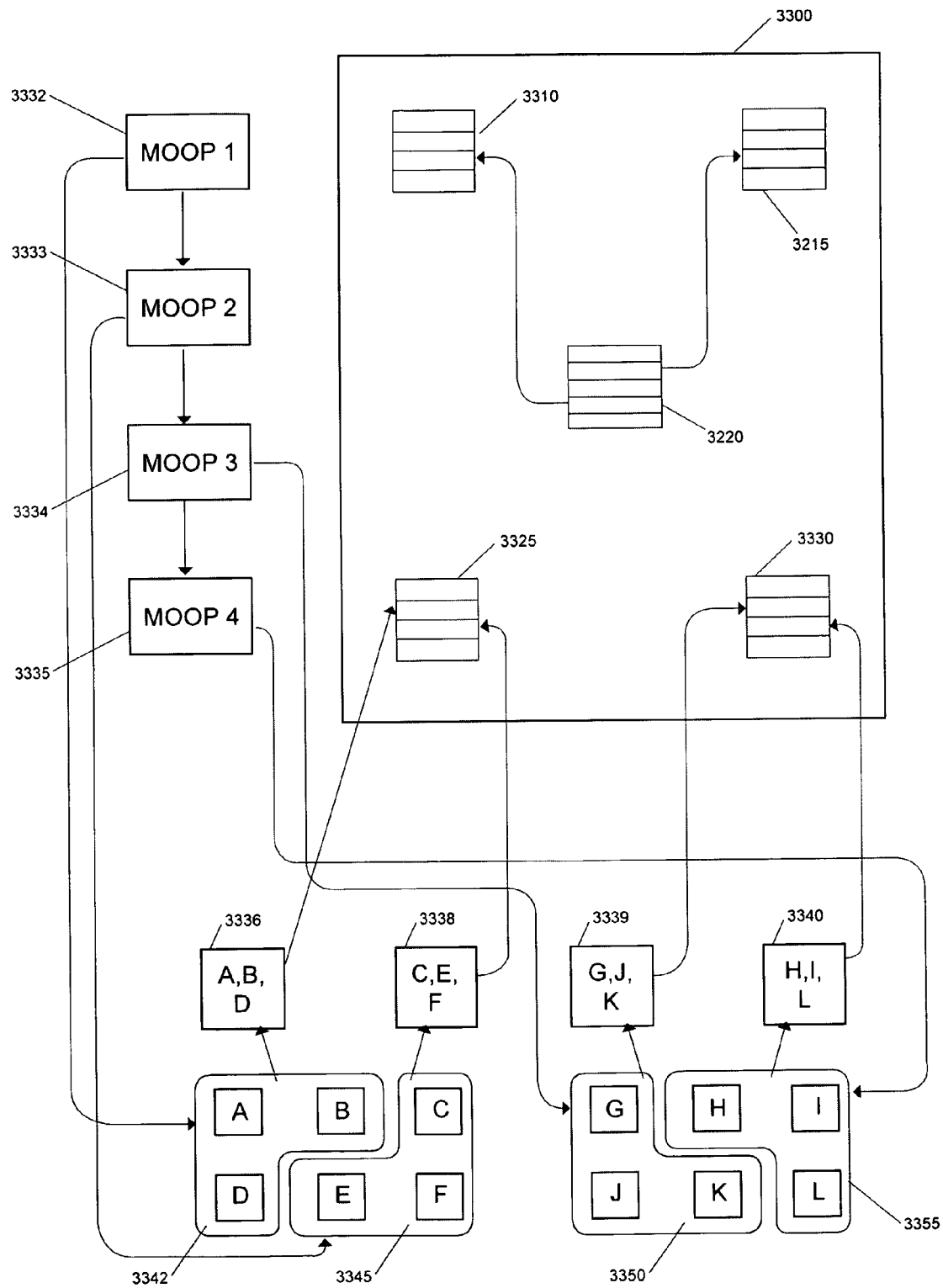
FIG. 33 is a schematic diagram showing the internal and external sources of the activation of reconfigurations of FPGAs.

FIG. 33 shows the internal and external sources of the activation of reconfigurations of FPGAs. MOOP 1 (3332) activates the generation of IP core elements from the IP core library (3342) to produce A, B and D (3336), which are installed at FPGA (3325) layer 2. MOOP 2 (3333) activates IP core elements from the IP core library (3345) to produce C, E and F (3338), which are installed at FPGA (3325) layer 3. MOOP 3 (3334) activates the generation of IP core elements from the IP core library (3350) to produce G, J and K (3339), which are installed at FPGA (3330) layer 2. MOOP 4 (3335) activates IP core elements from the IP core library (3350) to produce H, I and L (3340), which are installed at FPGA (3330) layer 3.

(1) 3D FPGA IP cores

Soft IP cores are applied to 3D FPGAs to perform specific hardware reconfigurations. The soft iP cores modify the arrangement of specific layers in the 3D FPGA. They are transmitted to the memory on each layer of the FPGA and modify the data sets in the LUTs. The soft IP cores guide the rearrangement of the hardware circuitry of specific logic blocks in a cluster of logic blocks on particular layers of the FPGA. The timing of the restructuration process are contingent on the satisfaction of constraints specified in the IP core.

IP cores are the key ingredient that activates the reprogrammability of the 3D FPGA. While hard and firm IP cores are wired into particular layers of the multi-layer system, soft IP cores modulate multi-layer circuit behavior by organizing the systematic actions of different layers.

(2) Eda Placement and Routing of 3D Netlists for FPGA Gates, Interconnects and Vias Soft IP cores are used to activate changes in FPGA structure by manipulating the hardware circuitry to transform from one ASIC position to another. They operate by using netlists, which are lists of logic gates and interconnects in specific functional positions. Soft cores use hardware description language (HDL) code, the most common of which is VHDL, whereby electronic design automation (EDA) software organizes FPGA design options. A netlist is a Boolean algebra representation of gates and standard cells, similar to assembly code. The key to netlists is the specific allocation of the order of gate configurations implemented with IP cores.

The IP cores are combinations of gate configurations, constructed by EDA methods in VHDL by using netlists. EDA tools are used to route and place specific hardware circuitry, such as ASICs. However, EDA tools are also useful for placement and routing of netlist structures in FPGAs, which model the dynamic change of ASIC positions for complex applications. The synthesis, placement and routing (SPR) of FPGA design flow are organized in soft IP cores by using EDA.

3D IP cores for 3D FPGAs do not yet exist. Prior 3D FPGAs use 2D EDA tools to treat specific layers on the 3D FPGA as a specific planar device.

The present system, however, introduces specific novelties in a 3D FPGA, including interlayer structural characteristics and multilayer behaviors. 3D netlists are applied to the factors referenced in the previous section involving 3D FPGAs. These EDA-driven placement and routing data apply to the reconfigurability of transformable 3D multi-layer FPGA tile clusters, autonomous inter-layer information sharing, intermittent, variable multi-layer restructuration and multifunctional multi-layer reconfigurability. The sharing and coordination of information between the layers of a 3D FPGA distinguish the 3D IP core from 2D models.

(3) Sequential IP Core Applied to Multi-Functionality in 3D FPGA

In complex indeterministic 3D FPGAs, the layers of the device operate both independently and in harmony with other layers. Each layer operates asynchronously from other layers. In this context, IP cores represent complex processes, not merely the combination of two specific ASIC positions. The use of IP cores provides seamless transitions between specific operations in order to avoid timing disruptions.

The application of IP cores to sequences of operations in a 3D FPGA reflects the controlling feature of the autonomous function of specific layers in the device. As an example, the 3D FPGA coordinates the oscillation of specific layers from one ASIC position to another and to yet another and so on in order to perform specific application tasks until a specific class of MOOPs is solved.

(4) Multiple Simultaneous IP Cores to Perform Multi-Node Operations for 3D FPGA

Though IP cores represent the practical means to implement specific programmability in FPGAs, 3D FPGAs involve autonomous functionality of multiple layers; thus the need for multiple IP cores in a multi-layer integrated circuit device demands a higher level of coordination.

SoC kernels combine multiple IP cores. By using multiple IP cores, an SoC coordinates multiple FPGAs. However, in the 3D SoC, multiple 3D FPGA layers are coordinated by implementation of multiple IP cores simultaneously.

The present system uses multiple simultaneous IP cores to coordinate multiple FPGA nodes in the 3D SoC as well. The present system's application of multiple IP cores represents a second-order behavior because multiple IP cores coordinate multiple 3D FPGA layers simultaneously.

(5) Evolvable IP Cores in 3D FPGA

Most IP cores in 2D FPGAs are static. That is, they are organized as a finite arrangement of netlists to reconfigure FPGAs into pre-established positions. 3D FPGAs are more dynamic than 2D FPGAs, allow for more reconfigurable options and are thus ultimately more flexible.

The current invention specifies the constraints needed to stimulate transformation of FPGA positions. In the 3D FPGA, the evolutionary characteristics are indeterministic as the different layers are coordinated to perform multiple simultaneous functions.

Different IP cores have different levels of evolvability roughly corresponding to the level of indeterministic reconfigurability of the 3D FPGA hardware circuitry. In this way, complex custom applications are evolved over time rather than pre-arranged by the deterministic design logic.

Evolvable IP cores are structured by using optimization algorithms that continuously update netlists to change gate structures until a task is completed. Transformation thresholds of evolvable IP cores are specified and refined for each application. Evolvable IP cores are also interactive with external environmental feedback. Adaptive EHW involves calibrating interaction thresholds by employing evolvable IP cores.

(6) Optimization Metaheuristic Algorithms Applied to IP Core Evolution in 3D FPGA In the present implementation, hybrid genetic algorithms (GA) are applied to synthetic IP core evolution. Combinatorial optimization problems are solved in EHW with hybrid GA.

Other metaheuristics, such as local search, swarm intelligence and artificial immune systems (AIS), are also applied to solve MOOPs in the context of EHW. Hybrid GA, swarm intelligence and AIS algorithms represent bio-inspired computing models. These metaheuristics are useful for complex IP cores to evolve solutions to combinatorial optimization problems.

The metaheuristics are programmed into the IP cores of indeterministic 3D FPGAs by using EDA tools to create novel placement and routing structures of hardware circuits employing evolvable netlists. The FPGAs receive feedback from the environment, which is input into the pre-set threshold contingencies of the IP core code. Activation of these thresholds then launches additional stages of functionality and so on until the optimization problems are solved.

The system employs Boolean logic and temporal logic to optimize metaheuristics for application to evolvable IP cores.

(7) System and Method for IP Core Library Applied to 3D FPGA and SoC

Since 3D FPGAs are complex reprogrammable devices, the IP cores that integrate into these systems are sophisticated as well. A single IP core is not sufficient to organize a 3D SoC, particularly since there are multiple layers in a single FPGA and multiple FPGAs in an 3D SoC that require simultaneous coordination and reorganization.

As a result of this complexity, IP cores are aggregated in library resources that are accessible for the combination and recombination of multiple IP cores for specific purposes. The IP core library accumulates into a multifunctional software application for 3D FPGAs and SoCs. Multiple vendors may add customized design capabilities to multiple software IP cores in the library.

Libraries of IP cores are organized according to both applications and FPGA functionality. A system hierarchy uses simpler IP cores for a majority of tasks, while highly complex evolutionary IP cores are used in complex multi-functional situations in indeterministic 3D FPGAs and SoCs that operate in uncertain environments.

(8) IP Core Generator Applied to 3D FPGAs

Because they are complex code applications, IP cores solve important optimization problems in FPGAs. In the most indeterministic environments, however, reconfigurable logic in 3D FPGAs is not programmable with foreseeable design criteria. Nevertheless, in order to maintain effectiveness, FPGAs require near-automatic response in order to be effective in real-time environments.

It is therefore necessary to devise a way to create optimal custom IP cores on-demand in order to satisfy these indeterministic criteria. In these cases, a 3D SoC itself reverse-engineers specifications for 3D FPGA IP core reconfigurability and auto generate code applicable to the solving of optimization problems.

Since the 3D SoC has numerous components, it is necessary to obtain a map of the SoC to analyze the constraints of specific reconfigurable parts so that compatibility with other parts in the system may be assessed. If programming one part of the SoC interferes with the optimal performance of other parts, the system will require rearrangement until optimized. These functions are performed with on-board EDA processes.

(9) Co-Evolution of Reprogrammable IP Core and 3D FPGA

Complex IP cores are not only evolutionary, they are co-evolutionary as well. As the environment changes, feedback is provided to the FPGA, which reconfigures its circuits to accommodate the changes in order to optimally perform its tasks. This feedback process creates the co-evolutionary characteristics that adapt IP cores in the course of their development.

The IP cores evolve in the 3D FPGA to not only program the hardware circuitry in various positions but also to adapt its programming in order to continually optimize its evolving reconfiguration process.

In another embodiment of the present system, multiple IP cores are coordinated among one another. Specifically, the IP cores of different 3D FPGAs are coordinated to interact with each other. Because they are interactive, they modify their programming in order to accommodate and manipulate the operation of corresponding FPGAs. This process allows the network in the 3D SoC to function as a unit to accomplish specific coordinated tasks in problem solving that requires multi-functionality, time-sensitivity and reprogrammability.

(10) Combinatorial Logic and Combinatorial Geometry Interaction in IP Core Elements in 3D FPGA IP core elements are simplified components of IP cores. Once a complex IP core is divided into constituent parts, the resulting pieces represent primitive elements. Each IP core element represents a specific netlist configuration of circuitry placement and routing in a tile or layer of a 3D FPGA. These elements are combined and recombined into complex IP cores with applications to specific 3D FPGA layers. Multifunctional IP cores, for example, are comprised of numerous IP core elements. Similarly, IP core elements are applied to specific FPGA layers to perform specific functions.

The unique combination and recombination of IP core elements is organized by combinatorial logic processes that optimize the functionality of reconfigurable 3D FPGAs. Because the reconfigurable operation of FPGAs requires transformation of physical hardware circuitry, the 3D FPGA evolution is a combinatorial geometry reconfiguration optimization problem. While the change of combinatorial logic guides the IP core elements using netlists and EDA processes, the ultimate effects are manifest in combinatorial geometric modifications at the hardware level.

IP core elements are bits of reusable code that combine with other bits for specific complex functions. Specific bits guide the evolution of specific reconfigurable tiles on layers of 3D FPGAs. The combination of these IP core elements influences the configurability of multiple tiles on multiple layers of the FPGA. This model allows complex multiple simultaneous operations in a 3D FPGA.

The IP core elements are accessed in the IP core library. The library organizes the IP core elements according to typologies that are application specific and hardware specific. When a problem emerges for which a solution is not clear, the library accesses the IP core elements in a particular family in order to identify past successful solutions. When similar solutions are identified, various relevant IP core elements are combined to produce unique solutions that are implemented in hardware. The combination and recombination of IP core elements produces custom solutions to complex hardware problems that are unique to 3D FPGAs.

The application and use of IP core elements produces a complete package of reconfigurable solutions.

In a further embodiment, multiple 3D FPGAs work together to solve problems by engaging in auctions in which the IP core elements are traded at specific times to solve particular complex optimization problems. One IP core element may provide a solution to a problem by combining with other elements in the IP core library of a 3D SoC in a particular set of 3D FPGAs.

The inspiration for IP core elements comes from the biologic combinatorial characteristics of amino acids for proteins. While specific proteins provide solutions to biological problems, the basic building blocks of the proteins lie in the amino acids.

(11) Combination of IP Core Elements for 3D FPGA

IP core elements are used in multiple layers of the 3D FPGA. Combinatorial optimization algorithms aggregate IP core elements in specific layers of the FPGA at particular times to solve specific MOOPs.

IP core elements are recombined in different FPGA layers at different times to solve similar problems that were solved in the past. This model of reuse of known solutions has the advantage of efficiency, much like the physiologic Immoral immune system will learn from past experience of the adaptive immune system.

Each combinatorial optimization problem requires a form of reverse engineering as the problem establishes requirements for a set of solutions. As the solution criteria become refined, various combinations of IP core elements are provided in an experimentation process, the sum of which is then applied to specific FPGA layers to be tested. As the system obtains feedback from its environment to test the solution's effectiveness, the constituent IP core elements' unique combination is modified, and the standards for solving the problem continually evolve until the solution to the problem is satisfied. This process of continuous reaggregation of IP core element parts as they are co-evolutionarily integrated into the 3D FPGA represents the solution to MOOPs in real time environments.

(12) Indeterministic Continuously Reprogrammable SoC Environmental Interaction Using Adaptive IP Cores IP cores are useful not only for programming FPGAs but for reprogramming them as well. The combination of IP cores is performed both simultaneously across multiple FPGA layers and also in sequence over time. Since reconfigurability is a way to modify trade-offs in real time, the use of adaptive IP cores in 3D FPGAs optimizes evolutionary behaviors of reconfigurable hardware.

The application of IP cores to different layers allows the multilayer FPGA to continuously restructure while simultaneously maintaining functionality. This continuous restructuring of specific layers allows seamless operation in uncertain environments with high performance computing characteristics.

An SoC stimulates activity using IP cores either endogenously or exogenously. When endogenous, the system is activated by internal programming. When exogenous, the system is activated by attainment of a predetermined environmental threshold. The continuous adaptation of the system between these two main motivations creates co-evolutionary mechanisms in which the SoC solves problems in real time.

Because they may be exogenously activated, IP cores in 3D FPGAs are remotely activated to perform specific functions.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.) the terms (including a reference to a "means") used to describe such elements are intended to correspond, unless otherwise indicated, to any element that performs the specified function of the described element (i.e., that is functionally equivalent), even though not structurally equivalent to the disclosed structure that performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

I claim:

1. A system for organizing IP cores in three dimensional FPGAs in a three dimensional system on a chip (3D SoC), comprising:
a multi-layer FPGA;
a multi-layer hybrid IC;
SRAM memory components on at least one FPGA layer;
LUTs in FPGA SRAM components;
soft IP cores;
wherein the IP cores include netlists;
wherein at least one IP core accesses a memory component to change an FPGA layer program code;
wherein an IP core program code is forwarded to a switch matrix apparatus on a FPGA layer;
wherein the IP core program code activates at least one logic block array on a FPGA layer tile to reconfigure its interconnects from one ASIC position to another ASIC position when specific criteria are satisfied; and
wherein when the FPGA layer in at least one logic block array are activated, they change their interconnection configuration to a new geometric position.

2. The system of claim 1, wherein:
at least two IP cores activates at least two FPGA layer components simultaneously; and
at least two FPGA layers activate the logic block arrays to reconfigure the interconnect configuration to a new geometric position.

3. The system of claim 1, wherein:
when the environment changes, the 3D SoC uses modeling processes to solve evolving multi-objective optimization problems (MOOPs);
the solutions to the MOOPs are input into IP cores to update the program code; and
the program code of the updated IP cores is applied to at least one FPGA layer in a multi-layer FPGA or a multi-layer hybrid IC.

4. The system of claim 1, wherein:
IP cores are organized in an IP core library;
the IP core library stores IP cores used to solve multi-objective optimization problems (MOOPs); and
IP cores are accessed from the IP core library to forward IP cores to at least one FPGA layer in a multi-layer FPGA or multi-layer hybrid IC.

5. A system for organizing IP cores in three dimensional FPGAs in a three dimensional system on a chip, comprising:
a multi-layer FPGA;
a multi-layer hybrid IC;
SRAM memory components on at least one FPGA layer;
LUTs in FPGA SRAM components;
soft IP cores including netlists;
wherein at least one IP core accesses a memory component to change FPGA layer program code;
wherein IP cores are constructed from IP core elements;
wherein the IP core elements are modular components of program code for specific applications;

wherein the IP core elements are combined into specific customized IP cores to solve specific multi-objective optimization problems (MOOPs);

wherein an aggregation of IP core elements is organized to apply to at least one layer in a multi-layer FPGA or multi-layer hybrid IC to reconfigure at least one logic block array to a specific geometrical configuration; and wherein the IP core elements are reaggregated into different multiple combinations for specific applications.

6. A system of claim 5, wherein:

the aggregated IP core elements are applied to specific device type applications of image sensor structures, MAC structures, ATSC protocols, wireless communications protocols and embedded controller protocols.

7. A system of claim 5, wherein:

the aggregated IP core elements are applied to specific tiles of specific layers of multi-layer FPGAs.

8. A system of claim 5, wherein:

multiple aggregated IP core elements are applied to tiles of at least two layers of a multilayer FPGA.

9. A system of claim 5, wherein:

the IP core elements are aggregated as a result of a process of solving MOOPs;

the IP core elements are combined into a unique configuration to solve MOOPs;

a modeling process generates and tests multiple scenarios to develop a solution to MOOPs in an evolving environment;

the modeling system forwards the solution to the MOOPs to a D-EDA system for layout of placement and routing of specific FPGA layers of logic block array interconnects to specific configurations;

the aggregated IP core elements are applied to specific tiles on at least one layer of a multi-layer FPGA to restructure program code to activate a specific placement and route configuration of interconnects within at least one logic block array; and the logic block array interconnects reconfigure a geometry of their structure.

10. A system for organizing IP cores in three dimensional FPGAs in a three dimensional system on a chip (3D SoC), comprising:

a multi-layer FPGA;

a multi-layer hybrid IC;

SRAM memory components on at least one FPGA layer;

LUTs in FPGA SRAM components;

soft IP cores including netlists;

wherein at least one IP core accesses a memory component to change an FPGA layer program code;

wherein the an evolving environment changes a position, and presents a set of MOOPs to the 3D SoC;

wherein the environment provides feedback to the multi-layer FPGA as they interact;

wherein the 3D SoC models multiple scenarios and solution options and applies the solution options to evolutionary IP cores;

wherein the evolutionary IP cores aggregate IP core elements;

wherein the evolutionary IP cores are applied to the multi-layer FPGA; and wherein the multi-layer FPGA continuously transforms its geometrical configuration to adapt to the evolving environmental changes.

11. A system of claim 10, wherein:

IP core elements are aggregated and reaggregated over multiple phases to apply changes of configuration to multiple layers of the multi-layer FPGA.

* * * * *